United States Patent
Kim et al.

(10) Patent No.: US 7,388,798 B2
(45) Date of Patent: Jun. 17, 2008

(54) SEMICONDUCTOR MEMORY DEVICE INCLUDING MEMORY CELL WITHOUT CAPACITOR

(75) Inventors: Jin-Young Kim, Seoul (KR); Yeong-Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 11/509,991

(22) Filed: Aug. 25, 2006

(65) Prior Publication Data
US 2007/0195626 A1 Aug. 23, 2007

(30) Foreign Application Priority Data
Feb. 21, 2006 (KR) .................. 10-2006-0016936

(51) Int. Cl.
*G11C 7/02* (2006.01)
(52) U.S. Cl. .................................. 365/210; 365/189.04
(58) Field of Classification Search ................ 365/210, 365/189.04
See application file for complete search history.

(56) References Cited

U.S. PATENT DOCUMENTS

| | | | |
|---|---|---|---|
| 6,650,565 B1 | 11/2003 | Ohsawa | 365/185.05 |
| 6,882,008 B1 | 4/2005 | Ohsawa | 257/347 |
| 2003/0231524 A1* | 12/2003 | Ohsawa | 365/189.07 |
| 2005/0068807 A1 | 3/2005 | Ohsawa | 365/185.2 |
| 2006/0092699 A1* | 5/2006 | Higashi et al. | 365/177 |
| 2007/0189068 A1* | 8/2007 | Lee | 365/185.2 |

* cited by examiner

*Primary Examiner*—Anh Phung
(74) *Attorney, Agent, or Firm*—Mills & Onello LLP

(57) ABSTRACT

A semiconductor memory device including a memory cell without a capacitor includes: a memory cell array block including first memory cells connected between a first bit line and first word lines and second memory cells connected between a second bit line and second word lines; and a reference memory cell array block including first reference memory cells connected between a first reference bit line connected to the first bit line and a first reference word line and second reference memory cells connected between a second reference bit line connected to the second bit line and a second reference word line. When the first word lines are selected, the second reference memory cells are selected, and when the second word lines are selected, the first reference memory cells are selected. Thus, each bit line includes a reference memory cell and outputs reference signal from the reference memory cell so that data can be precisely sensed during a read operation.

20 Claims, 10 Drawing Sheets

SEMICONDUCTOR MEMORY DEVICE INCLUDING MEMORY CELL WITHOUT CAPACITOR

This application claims priority to Korean Patent Application No. 10-2006-0016936, filed Feb. 21, 2006, the contents of which are hereby incorporated herein by reference in their entirety.

BACKGROUND OF THE INVENTION

1. Field of the Invention

The present invention relates to a semiconductor memory device and, more particularly, to a semiconductor memory device including a memory cell without a capacitor in which a dynamic memory cell includes a single transistor with a floating body.

2. Description of Related Art

In general, a dynamic random access memory (DRAM) device, which is one type of semiconductor memory device, includes a memory cell that is comprised of a transistor and a capacitor, so that data "0" or "1" is determined depending on whether or not the capacitor is electrically charged. That is, a conventional DRAM device needs a capacitor to store data. However, as the integration density of semiconductor memory devices increases, a memory cell using a capacitor becomes an obstacle in decreasing the layout of the semiconductor memory devices.

Accordingly, a semiconductor memory device in which a memory cell does not require a capacitor, but includes only a transistor, has been recently proposed. This semiconductor memory device includes a memory cell comprising a transistor having a floating body called a "floating body cell (FBC)."

This transistor can store a plurality of carriers in the floating body. The threshold voltage of the transistor varies due to a body effect according to whether or not the carriers are stored, and variations in the threshold voltage of the transistor causes variations in the amount of current through the transistor, thus enabling the determination of data.

Since the carriers stored in the floating body recombine and dissipate after a specific duration of time, the FBC should be periodically refreshed to retain data, so that the FBC can serve as a memory cell of a DRAM.

FIG. 1 is a plan view of a memory cell array block of a conventional semiconductor memory device including an FBC without a capacitor.

In FIG. 1, a memory cell array block 10 includes word lines WL, bit lines BL, memory cells MC, reference word lines RWL0 and RWL1, reference bit lines RBL0 and RBL1, reference memory cells RC0 and RC1, equalizer lines EQL, bit line selectors 12, reference voltage generators 14, and sense amplifiers 16.

The memory cells MC are disposed at intersections of word lines WL arranged in a row direction and bit lines BL arranged in a column direction. Each of the memory cells MC, which includes an NMOS transistor with a floating body, has a gate terminal connected to the word line WL, a drain terminal connected to the bit line, and a source terminal that is grounded.

In order to write data "1" in the memory cell MC, the NMOS transistor is driven in a saturation region. Specifically, when a predetermined voltage (e.g., 1.5 V) is applied to the gate terminal through the word line WL and a voltage higher than the predetermined voltage (e.g., 1.5 V) or the same is applied to the drain terminal through the bit line BL, a large number of electron-hole pairs are created in the floating body near the drain due to impact ionization. In this case, the electrons are absorbed at the drain terminal, but the holes are stored in the floating body.

A hole current generated by the impact ionization is equilibrated with a forward current of a pn-junction between the floating body and the source, so that the floating body reaches an equilibrium state. That is, the state of data "1" is a state where the holes are stored in the floating body.

In order to write data "0" in the memory cell MC, a predetermined voltage (e.g., 1.5 V) is applied to the gate terminal through the word line WL, and a voltage lower than the predetermined voltage (e.g., −1.5 V) is applied to the drain terminal through the bit line BL. Thus, the floating body and the drain, i.e., a p region and an n region are forwardly biased, so that most of the holes stored in the floating body are absorbed at the drain terminal. Accordingly, the state of data "0" is a state where the number of holes stored in the floating body is reduced.

When the data "1" is stored, a lot of holes are stored in the floating body of the NMOS transistor, so that the threshold voltage of the NMOS transistor decreases due to a body effect. When the data "0" is stored, holes stored in the floating body of the NMOS transistor are reduced, so that the threshold voltage of the NMOS transistor increases.

In reading data from the memory cell MC, the NMOS transistor is driven in a linear region. Specifically, when a predetermined voltage (e.g., 1.5 V) is applied to the gate terminal through the word line WL and a voltage (e.g., 0.2 V) required for driving the NMOS transistor in the linear region is applied to the drain terminal through the bit line BL, the NMOS transistor generates a current difference between the bit lines BL due to variation in the threshold voltage caused by a difference in the number of holes stored in the floating body, senses the current difference, and determines data "0" or data "1." When the data "1" is stored in the memory cell MC, since the threshold voltage of the NMOS transistor is low, a current supplied to the bit line BL during reading of data increases. When the data "0" is stored in the memory cell MC, since the threshold voltage of the NMOS transistor is high, a current supplied to the bit line BL during reading of data decreases.

The reference memory cells RC0 and RC1 are connected between the reference word lines RWL0 and RWL1, which are positioned at both ends of the word lines WL, and the reference bit lines RBL0 and RBL1, which are positioned between the bit lines BL. These reference memory cells RC0 and RC1 store data "0" and data "1," respectively, in order to generate a reference signal for comparing with data output from the memory cell MC.

The reference bit lines RBL0 and RBL1 are each positioned between a predetermined number of bit lines BL in order to facilitate the precise transmission of the reference signals to the sense amplifiers 16 positioned at both ends of the memory cell array. Thus, each of the reference bit lines RBL0 and RBL1 transmits the reference signals to its near sense amplifier 16.

The reference word lines RWL0 and RWL1 are positioned at both ends of the memory cell array. The reference word line RWL0 serves to select the reference memory cell RC0, and the reference word line RWL1 serves to select the reference memory cell RC1.

The equalizer lines EQL are disposed between the reference word lines RWL0 and RWL1 and the word lines WL, which are positioned at both ends of the memory cell array, and serve to reduce Interaction between the memory cell MC and the reference memory cells RC0 and RC1.

The bit line selectors 12 select one of the bit lines BL in response to a bit line selection signal (not shown) and connect the selected bit line BL to the corresponding sense amplifier 16.

The reference voltage generator 14 generates a voltage in response to a reference signal generated by a combination of currents corresponding to data "0" and data "1" that are applied from the reference memory cells RC0 and RC1, respectively.

The sense amplifier 16 receives a current corresponding to the data of the memory cell MC through the bit lines BL and generates a voltage in response to the received current.

The semiconductor memory devices having the FBC make use of the reference bit lines RBL0 and RBL1 instead of inverted bit lines corresponding to the bit lines BL, unlike conventional semiconductor memory devices. A conventional sense amplifier senses data based on a voltage difference, whereas the sense amplifier 16 of the semiconductor memory device having the FBC senses data based on a current difference. Thus, because the sense amplifier 16 is larger than the memory cell MC, one sense amplifier 16 can service a plurality of bit lines BL. In FIG. 1, one sense amplifier 16 is shared by 8 bit lines BL.

Like the sense amplifier 16, the reference memory cells RC0 and RC1 are also shared. Since the semiconductor memory device having the FBC has no inverted bit line, it needs a reference signal required for determining the data of the memory cell MC. Here, the reference signal is generated by a combination of currents output from the reference memory cells RC0 and RC1 that store data "0" and data "1," respectively, and output to the reference voltage generator 14 through the reference bit lines RBL0 and RBL1. In FIG. 1, the reference bit lines RBL0 and RBL1, which are connected to the reference memory cells RC0 and RC1, respectively, are vertically interposed between a first set of 8 bit lines BL and another set of 8 bit lines BL and thus shared by 16 bit lines BL.

However, the semiconductor memory device having the FBC without a capacitor as shown in FIG. 1 uses one reference bit line RBL0 or RBL1 shared by a plurality of bit lines BL. Accordingly, there may be a difference in data sensed by the sense amplifier 16 between when data is read from the memory cell MC near the reference bit lines RBL0 and RBL1 and when data is read from the memory cell MC far from the reference bit lines RBL0 and RBL1. In addition, currents corresponding to data of the reference memory cells RC0 and RC1 and the memory cell MC may vary with a change in fabrication process, voltage, or operating temperature, so that an error in data sensed by the sense amplifier 16 may result.

SUMMARY OF THE INVENTION

According to various aspects of the disclosure provided is a semiconductor memory device including a memory cell without a capacitor, which transmits exact data to a sense amplifier irrespective of the position of the memory cell.

In one aspect, provided is directed a semiconductor memory device including a memory cell without a capacitor. The device includes: a memory cell array block configured to store data, including first memory cells and second memory cells, each first memory cell having a floating body connected between a first bit line and a set of first word lines, each second memory cell having a floating body connected between a second bit line and a set of second word lines; and a reference memory cell array block configured to output a reference signal, including first reference memory cells and second reference memory cells, each first reference memory cell having a floating body connected between a first reference bit line connected to the first bit line and a first reference word line, each second reference memory cell having a floating body connected between a second reference bit line connected to the second bit line and a second reference word line, wherein when the first word lines are selected, the second reference memory cells are selected, when the second word lines are selected, the first reference memory cells are selected, and the reference signal is generated from a combination of data "1" and data "0" that are stored in the first and second reference memory cells.

The semiconductor memory device can further include at least one sense amplifier configured to receive the data and the reference signal to sense and determine the data.

Each of the first reference memory cells can be connected between first and second sub reference bit lines, which diverge from the first reference bit line, and the first reference word line, and store data "1" and data "0," and each of the second reference memory cells can be connected between third and fourth sub reference bit lines, which diverge from the second reference bit line, and the second reference word line, and store data "1" and data "0."

The reference memory cell array block can further comprise: two first reference memory cell isolation switches configured to isolate the first reference memory cells from the memory cell array block in response to a first reference memory cell isolation signal; two second reference memory cell isolation switches configured to isolate the second reference memory cells from the memory cell array block in response to a second reference memory cell isolation signal; and four reference memory cell refresh switches configured to connect a first power supply configured to supply a voltage corresponding to the data "1" and a second power supply configured to supply a voltage corresponding to the data "0" with to the first and the second reference memory cells in response to a reference memory cell refresh signal configured to refresh the first and second reference memory cells.

The semiconductor memory device can further comprise a controller configured to decode externally applied addresses during a read operation to enable a pair of adjacent bit lines, wherein one bit line of the pair of adjacent bit lines which is selected from a set of the first bit lines and the other bit line of the pair of adjacent but lines which is selected from a set of the second bit lines, wherein the controller is configured to turn off the first reference memory cell isolation switches and to turn on the second reference memory cell isolation switches when the first word line and the second reference word line are enabled, and to turn on the first reference memory cell isolation switches and to turn off the second reference memory cell isolation switches when the second word line and the first reference word line are enabled.

The controller can comprise a row decoder configured to decode a first row address of the externally applied addresses during the read operation to enable one word line of the first and second word lines and one reference word line of the first and second reference word lines corresponding to the one word line; a bit line selection signal generator configured to receive a second row address of the externally applied addresses during the read operation to output a bit line selection signal configured to select the first and second bit lines; a bit line selector configured to receive the bit line selection signal during the read operation to enable a pair of adjacent bit lines, which are composed comprised of a bit line selected from the first bit lines and a bit line selected from the second bit lines; a column decoder configured to decode a column address of the externally applied addresses during the read operation to enable one of column selection signals configured to select one of the sense amplifiers; and a control signal generator configured to enable a sense amplifier enable signal and a write back signal, to disable the reference memory cell refresh signal, and to enable one of the first and second reference memory cell isolation signals during the read operation.

Each of the first reference memory cells can be connected between the first reference bit line and the first reference word line and can store data "1" and data "0," and each of the second reference memory cells can be connected between the second reference bit line and the second reference word line and can store data "1" and data "0."

The reference memory array block can comprise: a first reference memory cell isolation switch configured to isolate the first reference memory cells from the memory cell array block in response to a first reference memory cell isolation signal; a second reference memory cell isolation switch configured to isolate the second reference memory cells from the memory cell array block in response to a second reference memory cell isolation signal; a first reference signal generating switch configured to connect the first reference memory cells that store data "0" and data "1," to generate the reference signal in response to a first reference signal generating signal; a second reference signal generating switch configured to connect the second reference memory cells that store data "0" and data "1," to generate the reference signal in response to a second reference signal generating signal; and four reference memory cell refresh switches configured to connect a first power supply configured to supply a voltage corresponding to data "1" and a second power supply configured to supply a voltage corresponding to data "0" with the first and second reference memory cells in response to a reference memory cell refresh signal configured to refresh the first and second reference memory cells.

The semiconductor memory device can further comprise: a controller configured to decode externally applied addresses during a read operation to enable a pair of adjacent bit lines, wherein one bit line of the pair of adjacent bit lines is selected from the first bit lines and the other bit line of the pair of adjacent bit lines is selected from the second bit lines, the controller is configured to turn on the second reference memory cell isolation switch and the second reference signal generating switch and to turn off the first reference memory cell isolation switch and the first reference signal generating switch when the first word line and the second reference word line are enabled, and to turn on the first reference memory cell isolation switch and the first reference signal generating switch and to turn off the second reference memory cell isolation switch and the second reference signal generating switch when the second word line and the first reference word line are enabled.

The controller can comprise: a row decoder configured to decode a first row address of the externally applied addresses during the read operation to enable one word line of the first and second word lines and one reference word line of the first and second reference word lines corresponding to the one word line; a bit line selection signal generator configured to receive a second row address of the externally applied addresses during the read operation to output a bit line selection signal configured to select the first and second bit lines; a bit line selector configured to receive the bit line selection signal during the read operation to enable a pair of adjacent bit lines, wherein one bit line is selected from the first bit lines and the other bit line is selected from the second bit lines; a column decoder configured to decode a column address of the externally applied addresses during the read operation to enable one of column selection signals configured to select one of the sense amplifiers; and a control signal generator configured to enable a sense amplifier enable signal and a write back signal, to disable the reference memory cell refresh signal, and to enable one of the first and second reference memory cell isolation signals and one of the first and second reference signal configured to generate signals during the read operation.

In accordance with another aspect of the disclosure, provided is a semiconductor memory device including a memory cell without a capacitor. The device comprises a memory cell array block configured to store data, the memory cell array block including first memory cells and second memory cells, each first memory cell having a floating body connected between a first bit line and a set of first word lines, each second memory cell having a floating body connected between a second bit line and a set of second word lines. And further comprises a reference memory cell array block configured to output a reference signal, the reference memory cell array block including a first reference memory cell and second reference memory cells, the first reference memory cell having a floating body connected between a first reference bit line connected to the first bit line and a reference word line and configured to store data "0" or data "1," each second reference memory cell having a floating body connected between a second reference bit line connected to the second bit line and the reference word line and configured store inverted data of the data stored in the first reference memory cell. When the first word lines or the second word lines are selected, the first reference memory cells and second reference memory cells are selected at the same time, so that the reference signal is generated by a combination of data "1" and data "0" that are stored in a first reference memory cell and a second reference memory cell.

The semiconductor memory device can further comprise one or more sense amplifiers configured to receive the data and the reference signal to sense and determine the data.

The reference memory cell array block can further comprise a reference signal generating switch configured to connect the first and second reference memory cells that store data "0" and data "1," to generate the reference signal in response to a reference signal generating signal; a first reference bit line selection switch configured to connect the first reference bit line with the first bit line in response to a first reference bit line selection signal enabled when the second word lines are selected; second reference bit line selection switch configured to connect the second reference bit line with the second bit line in response to a second reference bit line selection signal enabled when the first word lines are selected; and two reference memory cell refresh switches configured to connect a first power supply configured to supply a voltage corresponding to data "1" and a second power supply configured to supply a voltage corresponding to data "0" with the first and second reference memory cells in response to a reference memory cell refresh signal configured to refresh the first and second reference memory cells.

The semiconductor memory device can further comprise: a controller configured to decode externally applied addresses during a read operation to enable a pair of bit lines, wherein one of the pair of bit lines is selected from the first bit lines and the other of the pair of bit lines is selected from the second bit lines, the controller configured to turn off the first reference bit line selection switch and to turn on the second reference bit line selection switch and the reference signal generating switch when the first word line and the reference word line are enabled, and to turn on the first reference bit line selection switch and the reference signal generating switch and to turn off the second reference bit line selection switch when the second word line and the reference word line are enabled.

The controller can comprise: a row decoder configured to decode a first row address of the externally applied addresses during the read operation to enable one word line of the first and second word lines and the reference word line; a bit line selection signal generator configured to receive a second row address of the externally applied addresses during the read operation to output a bit line selection signal configured to select the first and second bit lines; a bit line selector configured to receive the bit line selection signal during the read operation to enable a pair of bit lines, which are comprised of one bit line selected from the first bit lines and the other bit line selected from the second bit lines; a column decoder configured to decode a column address of the externally applied addresses during the read operation to enable one of column selection signals configured to select one of the sense amplifiers; and a control signal generator configured to enable a sense amplifier enable signal, a write back signal, and the reference signal generating signal and to disable the reference memory cell refresh signal during the read operation.

In accordance with another aspect of the disclosure provided is a semiconductor memory device including a memory cell without a capacitor. The device comprises: a memory cell array block configured for storing data, the memory cell array block including first memory cells and second memory cells, each first memory cell having a floating body connected between a first pair of bit lines including first and third bit lines and a set of first word lines, each second memory cell having a floating body connected between a second pair of bit lines including second and fourth bit lines and a set of second word lines; and a reference memory cell array block configured to output a reference signal, the reference memory cell array block having first reference memory cells and second reference memory cells, each first reference memory cell having a floating body connected between first and third reference bit lines, which are connected to the first and third bit lines, and a first reference word line and configured to output the reference signal, each second reference memory cell having a floating body connected between second and fourth reference bit lines, which are connected to the second and fourth bit lines, and a second reference word line and configured to output the reference signal. When the first word lines are selected, the second reference memory cells are selected, when the second word lines are selected, the first reference memory cells are selected, and the reference signal is generated by a combination of data "1" and data "0" that are stored in the first and second reference memory cells.

The semiconductor memory device can further comprise a set of sense amplifiers configured to receive the data and the reference signal to sense and determine the data.

The memory cell array block can further comprise: a first bit line selection switch configured to connect the first bit line with the sense amplifier in response to a bit line selection signal; a second bit line selection switch configured to connect the second bit line with the sense amplifier in response to the bit line selection signal; a third bit line selection switch configured to connect the third bit line with the sense amplifier in response to the bit line selection signal; and a fourth bit line selection switch configured to connect the fourth bit line with the sense amplifier in response to the bit line selection switch.

The semiconductor memory device can further comprise: a controller configured to decode externally applied addresses during a read operation, the controller configured to additionally select the second and fourth bit lines, turning on the first, second, and fourth bit line selection switches, and to turn off the third bit line selection switch when the first word line, the first bit line, and the second reference word line are enabled; to additionally select the second and fourth bit lines, to turn on the second, third, and fourth bit line selection switches, and to turn off the first bit line selection switch when the first word line, the third bit line, and the second reference word line are enabled; to additionally select the first and third bit lines, to turn on the first, third, and fourth bit line selection switches, and to turn off the second bit line selection switch when the second word line, the second bit line, and the first reference word line are enabled; and to additionally select the first and third bit lines, to turn on the first, second, and third bit line selection switches, and to turn off the fourth bit line selection switch when the second word line, the fourth bit line, and the first reference word line are enabled.

The controller can comprise: a row decoder configured to decode a first row address of the externally applied addresses during the read operation to enable one word line of the first and second word lines and one reference word line of the first and second reference word lines corresponding to the one word line; a bit line selection signal generator configured to receive a second row address of the externally applied addresses during the read operation to output the bit line selection signal configured to select the first, second, third, and fourth bit lines; a bit line selector configured to receive the bit line selection signal during the read operation to enable three bit lines of the first, second, third, and fourth bit lines; a column decoder configured to decode a column address of the externally applied addresses during the read operation to enable one of column selection signals configured to select one of the sense amplifiers; and a control signal generator configured to enable a sense amplifier enable signal and a write back signal during the read operation.

BRIEF DESCRIPTION OF THE DRAWINGS

The foregoing exemplary embodiments and the accompanying drawings are not necessarily to scale, emphasis instead being placed upon illustrating various aspects of the invention.

DETAILED DESCRIPTION OF THE INVENTION

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

A semiconductor memory device including memory cells that do not include a capacitor will now be described more fully hereinafter with reference to the accompanying drawings, in which exemplary embodiments are shown.

Figure 2:
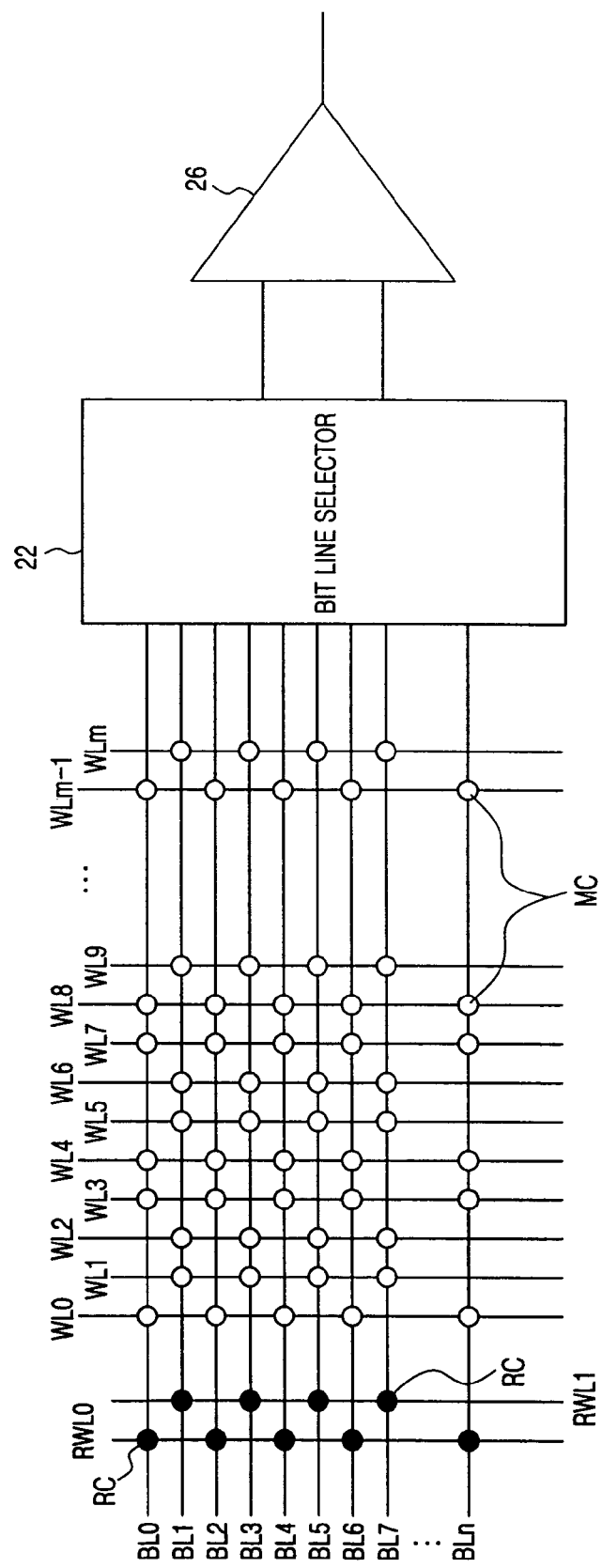
FIG. 2 is a block diagram of a folded-bit-line-type memory cell array block of a semiconductor memory device including a memory cell without a capacitor according to an exemplary embodiment of the present disclosure.

FIG. 2 is a block diagram of a folded-bit-line-type memory cell array block of a semiconductor memory device including memory cells that do not include a capacitor.

The memory cell array block of FIG. 2 includes: a plurality of memory cells MC, which are connected between a plurality of word lines WL0, WL1, ..., and WLm and a plurality of bit lines BL0, BL1, ..., and BLn, respectively; a plurality of reference memory cells RC, which are connected between two reference word lines RWL0 and RWL1 and the bit lines BL0, BL1, ..., and BLn, respectively; a bit line selector 22, which selects two bit lines among the bit lines BL0, BL1, ..., and BLn to select the memory cell MC and the reference memory cell RC; and a sense amplifier 26, which senses data signals and a reference signal applied through the two selected bit lines, from which it determines the value of data in the memory cells.

Figure 1:
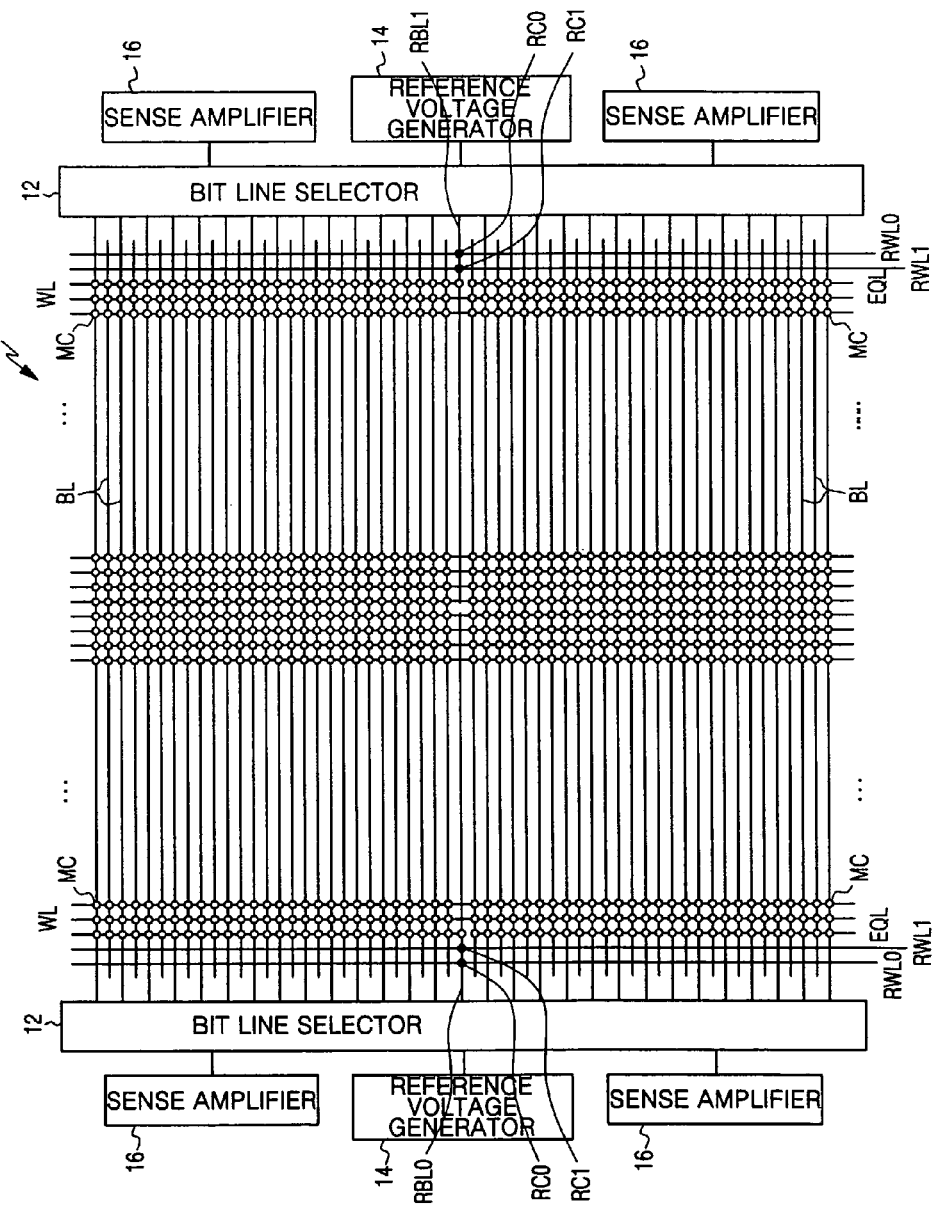
FIG. 1 illustrates a memory cell array block of a conventional semiconductor memory device including a memory cell without a capacitor.

In FIG. 1, the cell array block of the conventional semiconductor memory device includes reference bit lines RBL0 and RBL1, which output reference signals, and the reference word lines RWL0 and RWL1 and the reference word lines RWL0 and RWL1, which output reference signals, which together select the corresponding reference memory cells RC. By comparison, in FIG. 2, the cell array block of the semiconductor memory device includes only reference word lines RWL0 and RWL1 without additional reference bit lines. However, since the respective reference memory cells RC are disposed between the bit lines BL0, BL1, ..., and BLn and the reference word lines RWL0 and RWL1, when one bit line is selected from the bit lines BL0, BL1, ..., and BLn, an adjacent bit line is selected at the same time so that a reference signal is output from the adjacent bit line.

Specifically, in FIG. 1, because the reference signal is applied to the reference bit lines RBL0 and RBL1, the bit line selector 12 selects only one bit line BL required for reading or writing data. However, in FIG. 2, the cell array block of the semiconductor memory device has no reference bit line so that a pair of adjacent bit lines are selected to read data.

For example, when data is read through the bit line BL0, the reference signal is output through the bit line BL1; and when data is read through the bit line BL7, the reference signal is output through the bit line BL6. Thus, data is output in a manner similar to that of the conventional semiconductor memory device, that is, using a pair of bit lines composed of a bit line and an inverted bit line. However, the conventional pair of bit lines output data and inverted data, but a pair of bit lines according to the embodiment of FIG. 2 output data and a reference signal.

Accordingly, when data is read from a memory cell MC, the bit line selector 22 selects a pair of bit lines among the bit lines BL0, BL1, ..., and BLn corresponding to that memory cell. Thus, when the memory cell MC are present on the same word line WL0, WL1, ..., or WLm at respective pair of bit lines, since the two memory cells MC are selected at the same time, the determination of data becomes impossible.

Therefore, in contrast to FIG. 1 wherein the memory cells MC are disposed at all intersections of the word lines WL and the bit lines BL, as illustrated in FIG. 2 the memory cells MC are disposed in an alternating pattern between the word lines WL0, WL1, ..., and WLm and the bit lines BL0, BL1, ..., and BLn.

Similarly, when a pair of bit lines is selected by the bit line selector 22, one of the two reference word lines RWL0 and RWL1 is selected in accordance with the selected word line WL0, WL1, ..., or WLm, to select the reference memory cell of the bit line that outputs a reference signal and not of the bit line that outputs data.

An illustrative operation of the semiconductor memory device including the memory cells that do not include a capacitor will now be described with reference to the exemplary embodiment of FIG. 2. During a read operation, a row address decoder (not shown) decodes an externally applied address, so that one word line WL1 is selected among the word lines WL0, WL1, ..., and WLm. Also, the bit line selector 22 selects two adjacent bit lines, e.g., BL2 and BL3, as a pair of bit lines among the bit lines BL0, BL1, ..., and BLn in response to a bit line selection signal generated based on the address. In this example, data is output through the bit line BL3 and the bit line BL2 outputs a reference signal. Here, from the two reference word lines RWL0 and RWL1, reference word line RWL0 is selected and the other is not selected so that the reference signal is output from the bit line BL2. A reference signal and the data stored in the memory cell MC, which is connected between the selected word line WL1 and bit line BL3 are applied to sense amplifier 26. The reference signal is generated by a combination of data "0" and data "1" stored in the reference memory cells RC0 and RC1, respectively, which are connected between the selected reference word line RWL0 and bit line BL2. The sense amplifier 26 receives the data and the reference signal, and senses and determines the data.

Accordingly, in the memory cell array block of the semiconductor memory device including the memory cells that do not include a capacitor as shown in FIG. 2, since each of the bit lines BL0, BL1, . . . , and BLn functions as a reference bit line with respect to its adjacent bit line, a distance between a selected bit line and its reference bit line is always substantially the same so that data errors can be reduced.

Although it is illustrated in FIG. 2 that the sense amplifier 26 is shared by the bit lines BL0, BL1, . . . , and BLn, in other embodiments, when the sense amplifier 26 has a sufficiently small size corresponding to a pair of bit lines, each pair of bit lines may have one corresponding sense amplifier 26. When one sense amplifier 26 is included corresponding to each pair of bit lines, the bit line selector 22 can be omitted, and each sense amplifier 26 can be selected by a column decoder (not shown) to select data.

Also, a typical semiconductor memory device having a floating body cell (FBC) uses the sense amplifier 26 that senses a current. However, the semiconductor memory device according to the present invention may employ a sense amplifier that senses a voltage according to the structure of the sense amplifier 26.

Figure 3:
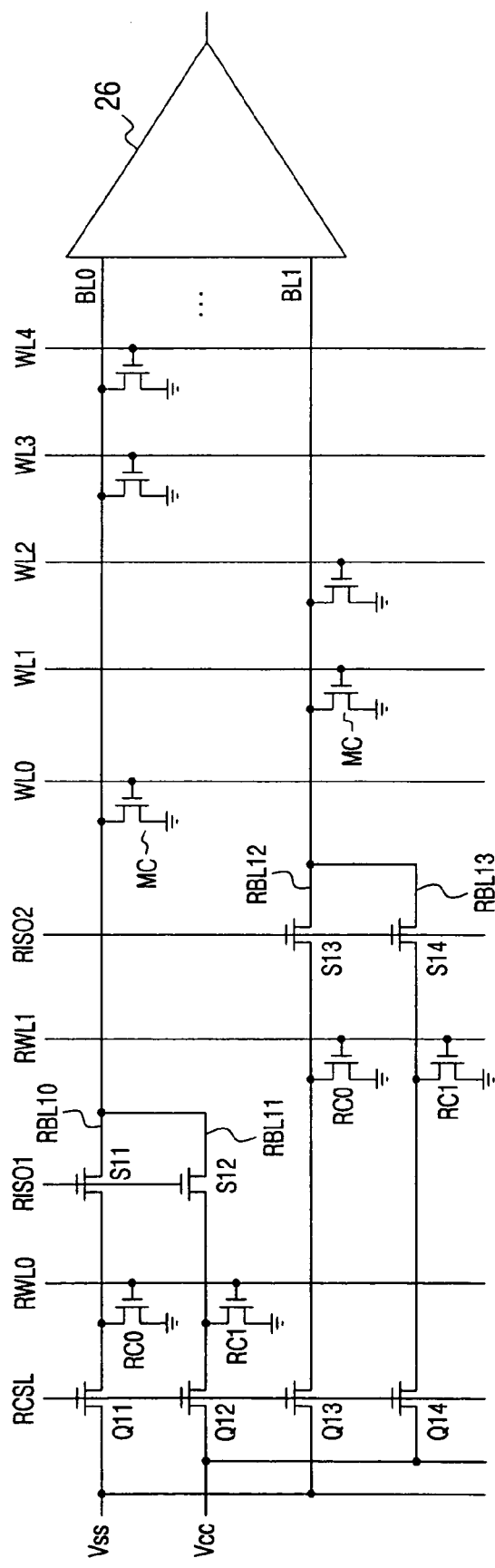
FIG. 3 illustrates a first example of the memory cell array block of the semiconductor memory device including the memory cell without the capacitor shown in FIG. 2.

FIG. 3 illustrates a first exemplary embodiment of a circuit that could be used to implement the memory cell array block of the semiconductor memory device including the memory cells that do not include a capacitor shown in FIG. 2.

FIG. 3 illustrates a portion of the memory cell array block shown in FIG. 2, which includes two bit lines BL0 and BL1, a plurality of word lines WL0, WL1, WL2, WL3, and WL4, memory cells MC, a sense amplifier 26, two reference word lines RWL0 and RWL1, reference memory cells RC0 and RC1, reference memory cell isolation switches S11, S12, S13, and S14, and reference memory cell refresh switches Q11, Q12, Q13, and Q14.

As in FIG. 2, the memory cell array block illustrated in FIG. 3 is a folded-bit-line-type memory cell array block. Thus, the memory cells MC are disposed in an alternating or zigzag pattern to prevent the memory cells MC disposed on the same word line WL0, WL1, . . . , or WLm from being selected by the two bit lines BL0 and BL1 at the same time.

Two sub reference bit lines RBL10 and RBL11, which comprise a reference bit line, diverge from the bit line BL0. And two sub reference bit lines RBL12 and RBL13, which constitute another reference bit line, diverge from the bit line BL1.

The reference memory cell RC0, which is connected between the sub reference bit line RBL10 and the reference word line RWL0, stores data "0," and the reference memory cell RC1, which is connected between the sub reference bit line RBL11 and the reference word line RWL0, stores data "1."

Similarly, the reference memory cell RC0, which is connected between the sub reference bit line RBL12 and the reference word line RWL1, stores data "0," and the reference memory cell RC1, which is connected between the sub bit line RBL13 and the reference word line RWL1, stores data "1."

The reference memory cell isolation switch S11 is disposed between the bit line BL0 and the reference memory cell RC0, the reference memory cell isolation switch S12 is disposed between the bit line BL0 and the reference memory cell RC1, the reference memory cell isolation switch S13 is disposed between the bit line BL1 and the reference memory cell RC0, and the reference memory cell isolation switch S14 is disposed between the bit line BL1 and the reference memory cell RC1. The reference memory cell isolation switches S11, S12, S13, and S14 isolate the bit lines BL0 and BL1 from the reference memory cells RC0 and RC1 in response to reference memory cell isolation signals RISO1 and RISO2.

A first power supply Vcc supplies a voltage corresponding to data "1" to the reference memory cell RC1 that stores the data "1." A second power supply Vss supplies a voltage corresponding to data "0" to the reference memory cell RC0 that stores the data "0." Thus, the first power supply Vcc and the second power supply Vss enable data to be stored or refreshed in the reference memory cells RC0 and RC1.

Each of the reference memory cell refresh switches Q11 and Q13 is disposed between the second power supply Vss and the reference memory cell RC0, and each of the reference memory cell refresh switches Q12 and Q14 is disposed between the first power supply Vcc and the reference memory cell RC1. When data is stored or refreshed in the reference memory cells RC0 and RC1, the reference memory cell refresh switches Q11, Q12, Q13, and Q14 connect the first and second power supplies Vcc and Vss with the respective reference memory cells RC0 and RC1 in response to a reference memory cell refresh signal RCSL.

The sense amplifier 26 receives data and a reference signal through the bit lines BL0 and BL1, and senses and determines the data.

The word lines WL0, WL3, and WL4 on which the memory cells MC are disposed with the bit line BL0 are referred to as first word lines. And the word lines WL1 and WL2 on which other memory cells MC are disposed with the bit line BL1 are referred to as second word lines.

The operation of the illustrative semiconductor memory device including the memory cells that do not include a capacitor will now be described with reference to FIG. 3. A row address decoder (not shown) decodes an externally applied address and selects one from a plurality of word lines WL0, WL1, WL2, WL3, and WL4. When the selected word line is one of the first word lines WL0, WL3, and WL4, the reference word line RWL1 is selected at the same time. When the selected word line is one of the second word lines WL1 and WL2, the reference word line RWL0 is selected at the same time.

For example, when the word line WL3 is selected, the reference memory cell isolation switches S11 and S12 are turned off in response to the reference memory cell isolation signal RISO1 and the reference memory cell isolation switches S13 and S14 are turned on in response to the reference memory cell isolation signal RISO2.

As a result, the sub reference bit lines RBL10 and RBL11 are disconnected from the bit line BL0, and the reference memory cells RC0 and RC1, which are connected between the sub reference bit lines RBL10 and RBL11 and the reference word line RWL0, are isolated from the memory cells MC.

The reference memory cells RC0 and RC1, which are connected between the sub reference bit lines RBL12 and RBL13 and the reference word line RWL1, are connected to the bit line BL1, and the bit line BL1 outputs a reference signal corresponding to a combination of data "0" and data "1," which are output from the reference memory cells RC0 and RC1, respectively, to the sense amplifier 26.

Also, the memory cell MC, which is connected between the word line WL3 and the bit line BL0, outputs stored data through the bit line BL0 to the sense amplifier 26. The sense amplifier 26 compares the data and the reference signal, which are applied through the bit lines BL0 and BL1, and determines the data.

In FIG. 3, the sub reference bit lines RBL10 and RBL11 are connected in parallel to the bit line BL0, and the sub reference bit lines RBL12 and RBL13 are connected in parallel to the bit line BL1. Also, the reference memory cells RC0 and RC1, which store data "0" or data "1," are disposed between the respective sub reference bit lines RBL10, RBL11, RBL12, and RBL13 and the reference word lines RWL0 and RWL1. Thus, when the memory cell MC of the adjacent bit line BL0 outputs data, the reference signal is output through the bit line BL1.

In FIG. 3, the reference memory cells RC0 and RC1 are disposed in a vertical direction relative to the bit lines BL0 and BL1, so that a distance between the bit lines BL0 and BL1 is increased by about twice the conventional semiconductor memory device.

Figure 4:
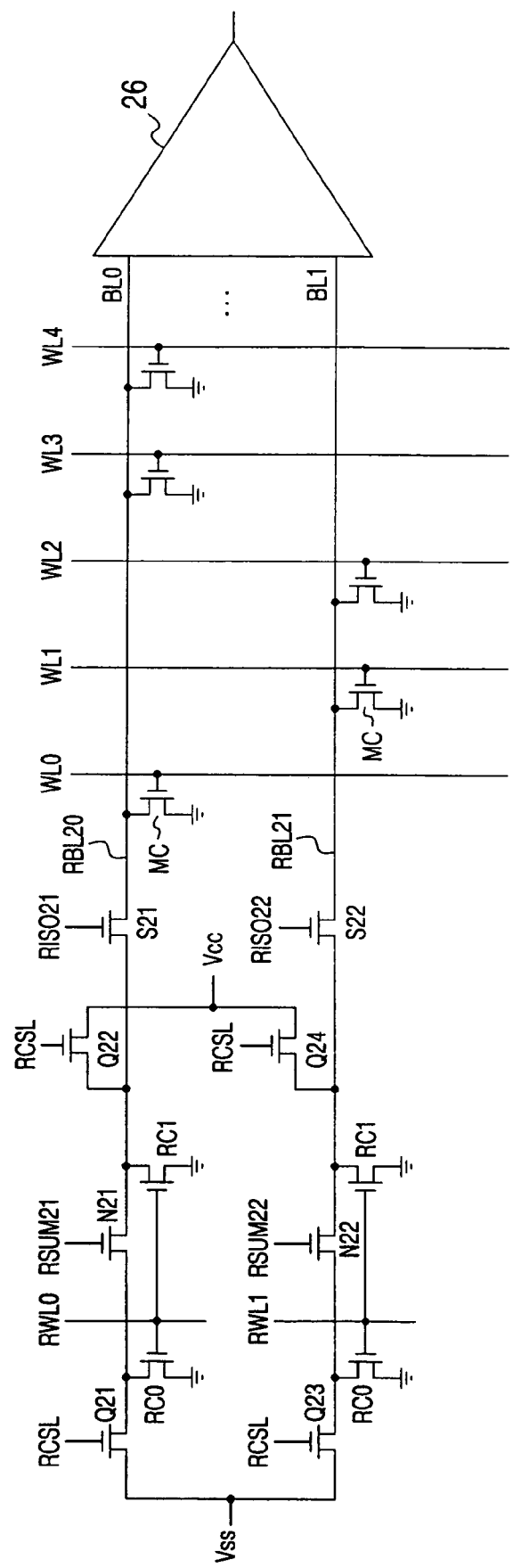
FIG. 4 illustrates a second example of the memory cell array block of the semiconductor memory device including the memory cell without the capacitor shown in FIG. 2.

FIG. 4 illustrates a second exemplary embodiment of a circuit that could be used to implement the memory cell array block of the semiconductor memory device including the memory cells that do not include a capacitor shown in FIG. 2.

In FIG. 4, reference memory cells RC0 and RC1 are horizontally disposed, unlike the vertically disposed reference memory cells RC0 and RC1 in FIG. 3. As a result, a distance between the bit lines BL0 and BL1 can be reduced.

Like FIG. 3, FIG. 4 illustrates a portion of the memory cell array block shown in FIG. 2, which includes two bit lines BL0 and BL1, a plurality of word lines WL0, WL1, WL2, WL3, and WL4, memory cells MC, a sense amplifier 26, two reference word lines RWL0 and RWL1, reference memory cells RC0 and RC1, reference memory cell isolation switches S21 and S22, and reference memory cell refresh switches Q21, Q22, Q23, and Q24. However, while FIG. 3 illustrates four sub reference bit lines RBL10, RBL11, RBL12, and RBL13 as the reference bit lines, FIG. 4 illustrates two reference bit lines RBL20 and RBL21 that extend from the bit lines BL0 and BL1. Also, the memory cell array block of FIG. 4 further includes reference signal generating switches N21 and N22, which generate a reference signal by a combination of data "0" and data "1," which are output from the reference memory cells RC0 and RC1 in response to reference signal generating signals RSUM21 and RSUM22, respectively.

The reference memory cells RC0 and RC1, which are connected between the reference bit line RBL20 and the reference word line RWL0, store data "0" and data "1," respectively. Similarly, the reference memory cells RC0 and RC1, which are connected between the reference bit line RBL21 and the reference word line RWL1, store data "0" and data "1," respectively.

The reference memory cell isolation switch S21 is disposed between the bit line BL0 and its corresponding reference memory cell RC0, and the reference memory cell isolation switch S22 is disposed between the bit line BL1 and its corresponding reference memory cell RC0. The reference memory cell isolation switches S21 and S22 isolate the corresponding memory cells MC from the reference memory cells RC0 and RC1 in response to reference memory cell isolation signals RISO21 and RISO22.

The reference signal generating switches N21 and N22 connect the reference memory cells RC0 and RC1 and generate the reference signal in response to the reference signal generating signals RSUM21 and RSUM22. When no reference signal is generated, the reference signal generating switches N21 and N22 are turned off such that they have no influence on each other and data can be refreshed.

Each of the reference memory cell refresh switches Q22 and Q24 is disposed between a first power supply Vcc and its corresponding reference memory cell RC1, and each of the reference memory cell refresh switches Q21 and Q23 is disposed between a second power supply Vss and its corresponding reference memory cell RC0. When data is stored or refreshed in the reference memory cells RC0 and RC1, the reference memory cell refresh switches Q21, Q22, Q23, and Q24 connect the first and second power supplies Vcc and Vss with the reference memory cells RC0 and RC1 in response to a reference memory cell refresh signal RCSL.

The sense amplifier 26 receives data and the reference signal through the bit lines BL0 and BL1, and senses and determines the data.

The operation of the illustrative semiconductor memory device including the memory cells that do not include a capacitor will now be described with reference to FIG. 4. A row address decoder (not shown) decodes an externally applied address and selects a word line from the word lines WL0, WL1, WL2, WL3, and WL4.

When the selected word line is one of first word lines WL0, WL3, and WL4, the reference word line RWL1 is selected at the same time. When the selected word line is one of second word lines WL1 and WL2, the reference word line RWL0 is selected at the same time. For example, when the word line WL2 is selected, the reference memory cell isolation switch S22 is turned off in response to the reference memory cell isolation signal RISO22 and the reference memory cell isolation switch S21 is turned on in response to the reference memory cell isolation signal RISO21.

Also, the reference signal generating switch N21 is turned on in response to the reference signal generating signal RSUM21 and the reference signal generating switch N22 is turned off in response to the reference signal generating signal RSUM22.

As a result, the reference bit line RBL21 is disconnected from the bit line BL1, and the reference memory cells RC0 and RC1, which are connected between the reference bit line RBL21 and the reference word line RWL1, are isolated from the corresponding memory cells MC.

The reference memory cells RC0 and RC1, which are connected between the reference bit line RBL20 and the reference word line RWL0, are connected to the bit line BL0, and the bit line BL0 outputs a reference signal corresponding to a combination of data "0" and data "1," which are output from the reference memory cells RC0 and RC1, respectively, to the sense amplifier 26. Also, the corresponding memory cell MC, which is connected between the word line WL2 and the bit line BL1, outputs stored data through the bit line BL1 to the sense amplifier 26.

The sense amplifier 26 compares the data and the reference signal, which are applied through the bit lines BL0 and BL1, and determines the data.

In FIG. 4, the reference bit lines RBL20 and RBL21 are connected to the bit lines BL0 and BL1, respectively, and the reference memory cells RC0 and RC1, which store "0" or data "1," are disposed between the reference bit lines RBL20 and RBL21 and the reference word lines RWL0 and RWL1. Thus, when the corresponding memory cell MC of the adjacent bit line BL1 outputs data, the reference signal is output through the bit line BL0.

Figure 5:
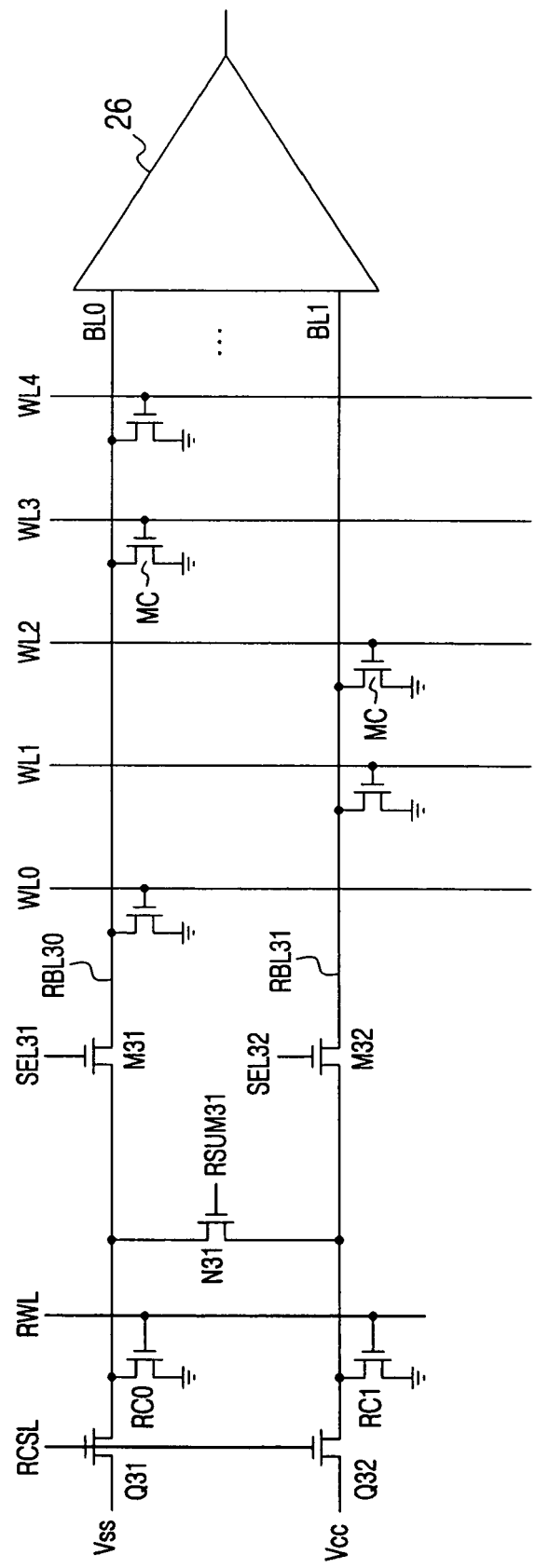
FIG. 5 illustrates a third example of the memory cell array block of the semiconductor memory device including the memory cell without the capacitor shown in FIG. 2.

FIG. 5 illustrates a third exemplary embodiment of a circuit that could be used to implement the memory cell array block of the semiconductor memory device including the memory cells that do not include a capacitor shown in FIG. 2.

While it is illustrated in FIG. 4 that a pair of reference memory cells RC0 and RC1, which store data "0" and data "1," respectively, are provided with respect to each bit line, in FIG. 5 a reference memory cell RC0 for storing data "0" is connected to bit line BL0 and a reference memory cell RC1 for storing data "1" is connected to bit line BL1, to reduce the layout size of the memory cell array block.

FIG. 5 illustrates a portion of the memory cell array block shown in FIG. 2, which includes two bit lines BL0 and BL1, a plurality of word lines WL0, WL1, WL2, WL3, and WL4, memory cells MC, a sense amplifier 26, a reference word line RWL, reference memory cells RC0 and RC1, reference memory cell refresh switches Q31 and Q32, and sub reference bit line selection switches M31 and M32. Also, two reference bit lines RBL30 and RBL31 extend from the bit lines BL0 and BL1, respectively. Further, the memory cell array block of FIG. 5 further includes a reference signal generating switch N31, which generates a reference signal by a combination of data "0" and data "1," that are output from the reference memory cells RC0 and RC1, respectively, in response to a reference signal generating signal RSUM31.

In FIG. 5, the memory cell array block includes only one reference word line RWL because the reference signal obtained by a combination of data "0" and data "1" output from the reference memory cells RC0 and RC1 of the reference bit lines RBL30 and RBL31 is output to a selected bit line.

The reference memory cell RC0, which is connected between the reference bit line RBL30 and the reference word line RWL, stores data "0," and the reference memory cell RC1, which is connected between the reference bit line RBL31 and the reference word line RWL, stores data "1."

The reference bit line selection switch M31 is disposed between the bit line BL0 and the reference memory cell RC0, and the reference bit line selection switch M32 is disposed between the bit line BL1 and the reference memory cell RC1. The reference bit line selection switches M31 and M32 connect the reference bit lines RBL30 and RBL31 with respective bit lines BL0 and BL1 in response to reference bit line selection signals SEL31 and SEL32.

The reference memory cell refresh switch Q31 is disposed between a second power supply Vss and the reference memory cell RC0, and the reference memory cell refresh switch Q32 is disposed between a first power supply Vcc and the reference memory cell RC1. When data is stored or refreshed in the reference memory cells RC0 and RC1, the reference memory cell refresh switches Q31 and Q32 connect the first and second power supplies Vcc and Vss with the reference memory cells RC0 and RC1 in response to a reference memory cell refresh signal RCSL.

The sense amplifier 26 receives the data and the reference signal through the bit lines BL0 and BL1, and senses and determines the data.

The operation of the illustrative semiconductor memory device including the memory cells that do not include a capacitor will now be described with reference to FIG. 5. A row address decoder (not shown) decodes an externally applied address and selects one word line from the word lines WL0, WL1, WL2, WL3, and WL4.

When the selected word line is one of first word lines WL0, WL3, and WL4, the reference bit line selection switch M32 is turned on in response to the reference bit line selection signal SEL32 and the reference bit line selection switch M31 is turned off in response to the reference bit line selection signal SEL31.

When the selected word line is one of second word lines WL1 and WL2, the reference bit line selection switch M31 is turned on in response to the reference bit line selection signal SEL31 and the reference bit line selection switch M32 is turned off in response to the reference bit line selection signal SEL32.

For example, when the word line WL0 is selected, the reference bit line selection switch M31 is turned off in response to the reference bit line selection signal SEL31, and the reference bit line selection switch M32 is turned on in response to the reference bit line selection signal SEL32. Also, the reference signal generating switch N31 is turned on in response to the reference signal generating signal RSUM31. As a result, the reference bit lines RBL30 and RBL31 are disconnected from the bit line BL0 and connected to the bit line BL1.

The reference memory cell RC0, which is connected between the reference bit line RBL0 and the reference word line RWL, outputs data "0," and the reference memory cell RC1, which is connected between the reference bit line RBL1 and the reference word line RWL, outputs data "1." The reference signal generating switch N31 combines the output data "0" and data "1" and outputs the combination result through the turned-on reference bit line selection switch M32 to the bit line BL1.

Also, the corresponding memory cell MC, which is connected between the word line WL0 and the bit line BL0, outputs stored data through the bit line BL0 to the sense amplifier 26. The sense amplifier 26 compares the data and the reference signal, which are applied through the bit lines BL0 and BL1, respectively, and determines the data.

In order to refresh the reference memory cells RC0 and RC1, the reference memory cell refresh switches Q31 and Q32 are turned on in response to the reference memory cell refresh signal RCSL, and the reference bit line selection switches M31 and M32 and the reference signal generating switch N31 are turned off such that the first and second power supplies Vcc and Vss do not change the data of the memory cell MC or the reference memory cells RC0 and RC1.

In FIG. 5, the reference bit lines RBL30 and RBL31 extend from the bit lines BL0 and BL1, respectively, and the reference memory cells RC0 and RC1, which store data "0" or data "1," are disposed between the their respective reference bit lines RBL30 and RBL31 and the reference word line RWL. Also, when the memory cell MC of the adjacent bit line BL0 outputs data using the bit line selection switches M31 and M32, the reference signal is output through the bit line BL1.

Also, in the structure shown in FIG. 5, the reference memory cells RC0 and RC1 can be refreshed using the sense amplifier 26. That is, by turning on the bit line selection switches M31 and M32 and turning off the reference signal generating switch N31, the sense amplifier 26 outputs data "0" to the bit line BL0 and outputs data "1" to the bit line BL1, so that the reference memory cells RC0 and RC1 can be refreshed. When the reference memory cells RC0 and RC1 are refreshed using the sense amplifier 26, the first and second power supplies Vcc and Vss or the reference memory cell refresh switches Q31 and Q32 may be omitted.

Figure 6:
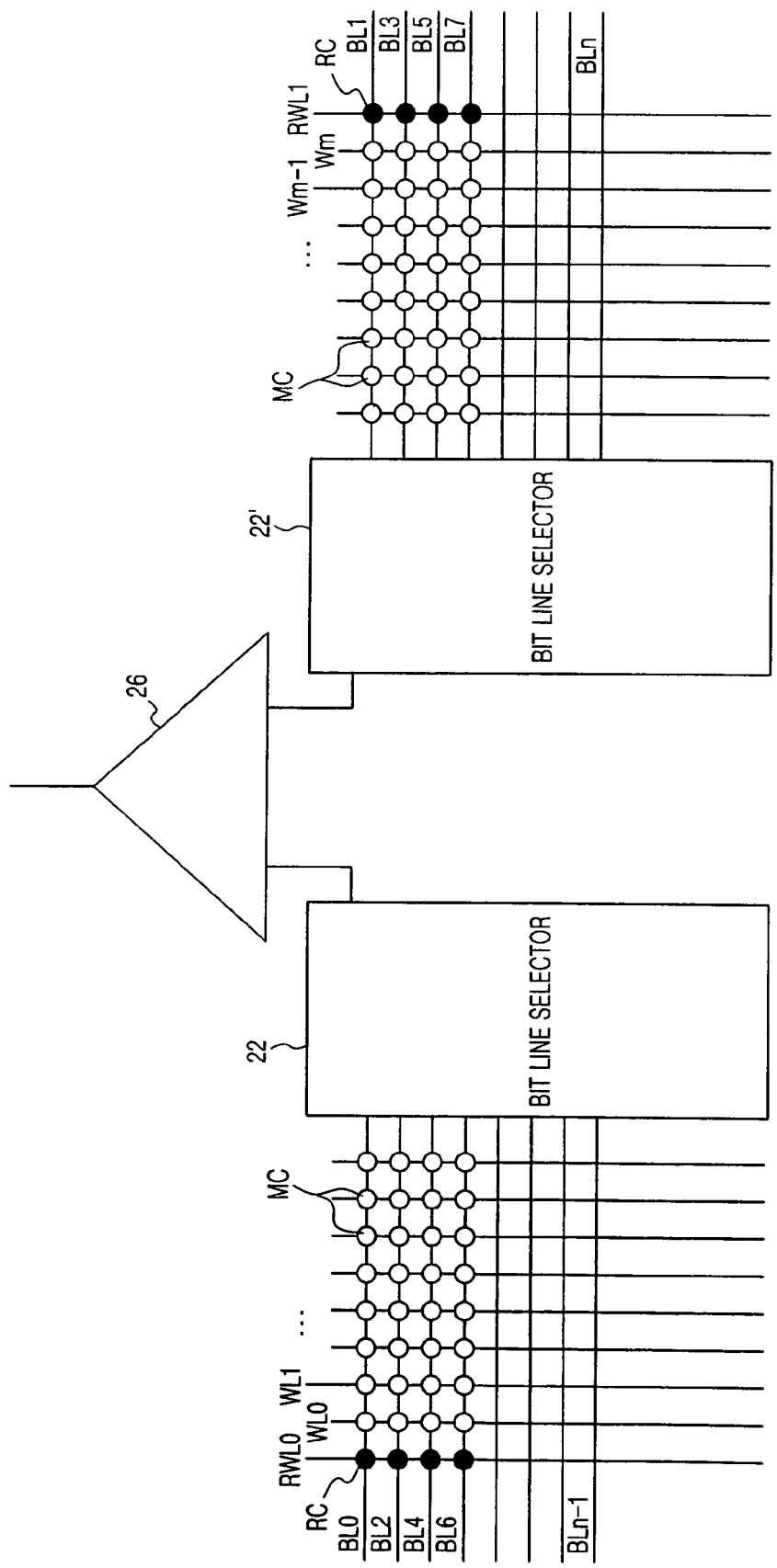
FIG. 6 is a block diagram of an open-bit-line-type memory cell array block of a semiconductor memory device including a memory cell without a capacitor according to another exemplary embodiment of the present disclosure.

FIG. 6 is a block diagram of an open-bit-line-type memory cell array block of a semiconductor memory device including a memory cells that do not include a capacitor.

In FIG. 6, the memory cell array block includes open-bit-line-type memory cell arrays, and a plurality of word lines WL0, WL1, . . . , and WLm and a plurality of bit lines BL0, BL1, . . . , and BLn are disposed on both ends of a sense amplifier 26.

The memory cell array block of FIG. 6 includes a plurality of memory cells MC, which are connected between the word lines WL0, WL1, . . . , and WLm and the bit lines BL0, BL1, . . . , and BLn, a plurality of reference memory cells RC. Each reference memory cell RC is connected between a reference word line RWL0, RWL1 and a corresponding bit line BL0, BL1, . . . , and BLn, and each bit line is connected to a bit line selector 22, 22'. For example, a reference memory cell RC is connected between reference word line RWL0 and bit line BL0 and another reference memory cell RC is connected between reference word line RWL0 and bit line BL2, and so on. Each of bit lines BL0 and BL2 is connected to bit line selector 22. Similarly, a reference cell RC is connected between reference word line RWL1 and bit line BL1, and so forth. Bit line BL1 is connected to another bit line selector 22'. Bit line selectors 22, 22' are disposed at each input of the sense amplifier 26 and select one from the bit lines BL0, BL1, . . . , and BLn to select one memory cell MC and one reference memory cell RC. The sense amplifier 26 senses data and a reference signal applied through the selected bit line and determines the data.

Like the memory cell array block of FIG. 2, the memory cell array block of FIG. 6 does not include reference bit lines RBL0 and RBL1, but rather only includes the reference word lines RWL0 and RWL1. Since the reference memory cells RC are disposed at all intersections of the bit lines BL0, BL1, . . . , and BLn and the reference word lines RWL0 and RWL1, when one bit line is selected from the bit lines BL0, BL1, . . . , and BLn, an adjacent bit line corresponding to the selected bit line is selected at the same time such that a reference signal is output from the adjacent bit line.

In FIG. 1, since the reference signal is applied to the reference bit lines RBL0 and RBL1, the bit line selector 12 selects only one bit line BL for reading or writing data. In contrast, in FIG. 6, since the memory cell array block has no reference bit line, a pair of adjacent bit lines are selected to read data. Accordingly, when data is read from the memory cell MC, the bit line selector 22, 22' selects a pair of corresponding bit lines from the bit lines BL0, BL1, . . . , and BLn.

Since the memory cell array block of FIG. 6 is an open-bit-line type, unlike the memory cell array block of FIG. 2, the memory cells MC are disposed at all intersections of the word lines WL0, WL1, . . . , and WLm and the bit lines BL0, BL1, . . . , and BLn.

However, once a pair of bit lines are selected by the bit line selector 22, 22', one of the reference word lines RWL0 and RWL1 is selected in conformity with the selected word line WL0, WL1, . . . , or WLm to select the reference memory cell RC of the bit line that outputs a reference signal and not the reference memory cell RC of the bit line that outputs data.

The operation of the semiconductor memory device including the memory cells that do not include a capacitor according of FIG. 6 will now be described. During a read operation, a row address decoder (not shown) decodes an externally applied address to select one word line WL1 from the word lines WL0, WL1, . . . , and WLm. Also, the bit line selector 22' selects one bit line BL3 from the bit lines BL0, BL1, . . . , and BLn and another bit line BL2 corresponding to the bit line BL3. Once data is output through the selected bit line BL3, a reference signal is output through the corresponding bit line BL2. In order to output the reference signal through the bit line BL2, one reference word line RWL0 of the two reference word lines RWL0 and RWL1 can be selected, and the other reference word line RWL1 is not selected. A reference signal, which is generated by a combination of data "0" and data "1" stored in the reference memory cell RC connected between the selected reference word line RWL0 and the bit line BL2, and data, which is stored in the memory cell MC connected between the selected word line WL1 and the bit line BL3, are applied to the sense amplifier 26. The sense amplifier 26 senses the reference signal and the data, determines the data, and outputs the determination result.

Accordingly, in the memory cell array block of the semiconductor memory device including the memory cells that do not include a capacitor as shown in FIG. 6, each of the bit lines BL0, BL1, . . . , and BLn functions as a reference bit line of its corresponding bit line. As a result, a distance between the selected bit line and the reference bit line is always about the same so that data errors can be reduced.

Although it is illustrated in FIG. 6 that the sense amplifier 26 is shared by the bit lines BL0, BL1, . . . , and BLn, as in FIG. 2, when the sense amplifier 26 has a sufficiently small size, each pair of bit lines may have one corresponding sense amplifier 26. When one sense amplifier 26 is included in each pair of bit lines, the bit line selector 23 may be omitted, and each sense amplifier 26 may be selected by a column decoder (not shown) to select data.

Also, a typical semiconductor memory device having a floating body cell (FBC) uses the sense amplifier 26 that senses a current. In contrast, a semiconductor memory device according to the present embodiments may use a sense amplifier that senses a voltage.

Figure 7:
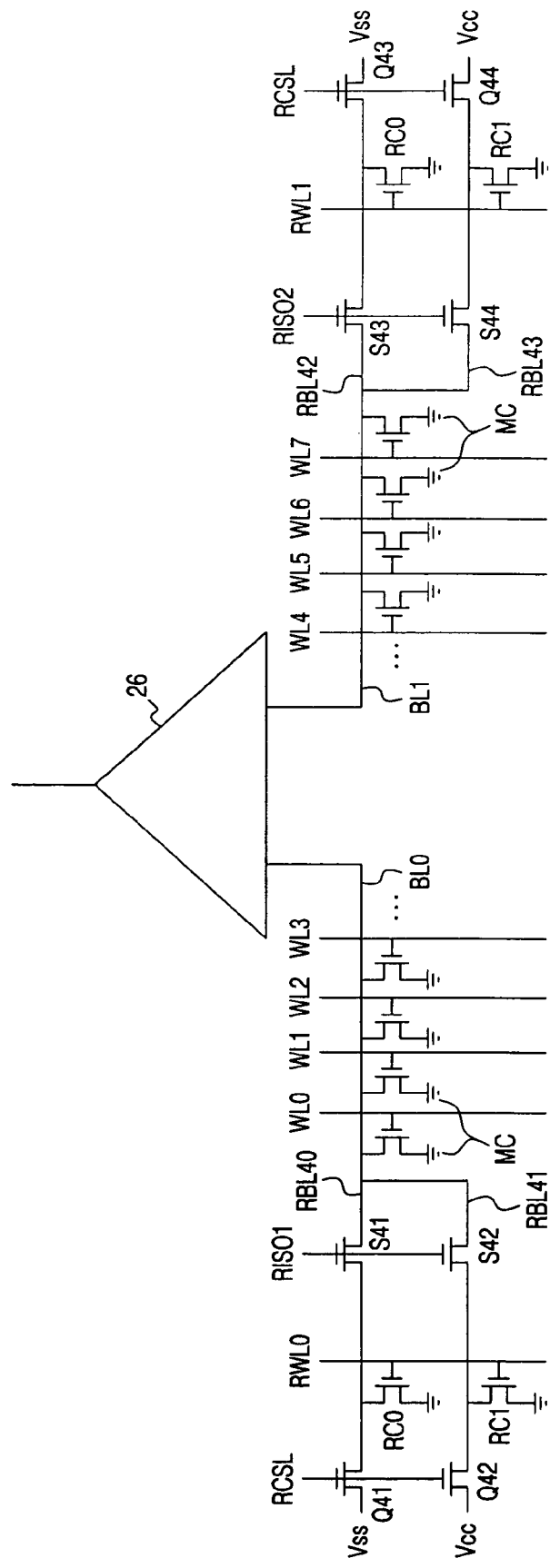
FIG. 7 illustrates a first example of the memory cell array block of the semiconductor memory device including the memory cell without the capacitor shown in FIG. 6.

FIG. 7 illustrates a first embodiment of a circuit that can be used to implement the memory cell array block of the semiconductor memory device including the memory cells that do not include a capacitor shown in FIG. 6.

FIG. 7 illustrates a portion of the memory cell array block of FIG. 6, which includes two bit lines BL0 and BL1, a plurality of word lines WL0, WL1, WL2, WL3, WL4, WL5, WL6, and WL7, memory cells MC, a sense amplifier 26, two reference word lines RWL0 and RWL1, reference memory cells RC0 and RC1, reference memory cell isolation switches S41, S42, S43, and S44, and reference memory cell refresh switches Q41, Q42, Q43, and Q44.

Since the memory cell array block of FIG. 7 is also an open-bit-line type, the memory cells MC are disposed at all intersections of the two bit lines BL0 and BL1 and the word lines WL0, WL1, WL2, WL3, WL4, WL5, WL6, and WL7.

As in FIG. 3, two sub reference bit lines RBL40 and RBL41 extend from and are connected in parallel to the bit line BL0, and two sub reference bit lines RBL42 and RBL43 extend from and are connected in parallel to the bit line BL1.

The reference memory cell RC0, which is connected between the sub bit line RBL40 and the reference word line RWL0, stores data "0," and the reference memory cell RC1, which is connected between the sub bit line RBL41 and the reference word line RWL0, stores data "1."

Also, the reference memory cell RC0, which is connected between the sub bit line RBL42 and the reference word line RWL1, stores data "0," and the reference memory cell RC1, which is connected between the sub bit line RBL43 and the reference word line RWL1, stores data "1."

The four reference memory cell isolation switches S41, S42, S43, and S44 are disposed between the bit lines BL0 and BL1 and the four reference memory cells RC0 and RC1. The four reference memory cell isolation switches S41, S42, S43, and S44 isolate the memory cell MC from the reference memory cells RC0 and RC1 in response to reference memory cell isolation signals RISO1 and RISO2.

A first power supply Vcc supplies a voltage corresponding to data "1" to the reference memory cell RC1 that stores the data "1," and a second power supply Vss supplies a voltage corresponding to data "0" to the reference memory cell RC0 that stores the data "0." Thus, the first and second power supplies Vcc and Vss enable data to be refreshed in the reference memory cells RC0 and RC1.

The four reference memory cell refresh switches Q41, Q42, Q43, and Q44 are disposed between the first and second power supplies Vcc and Vss and the reference memory cells RC0 and RC1, respectively. When data is stored or refreshed in the reference memory cells RC0 and RC1, the reference memory cell refresh switches Q41, Q42, Q43, and Q44 connect the first and second power supplies Vcc and Vss with the reference memory cells RC0 and RC1 in response to a reference memory cell refresh signal RCSL.

The sense amplifier 26 receives the data and the reference signal through the bit lines BL0 and BL1, and senses and determines the data.

The word lines WL0, WL1, WL2, and WL3, which are disposed on one side of the sense amplifier 26, are referred to as first word lines, and the word lines WL4, WL5, WL6, and WL7, which are disposed on the other side of the sense amplifier 26, are referred to as second word lines.

The operation of the semiconductor memory device including memory cells that do not include a capacitor will now be described with reference to FIG. 7. A row address decoder (not shown) decodes an externally applied address and selects one from the word lines WL0, WL1, WL2, WL3, WL4, WL5, WL6, and WL7. When the selected word line is one of the first word lines WL0, WL1, WL2, and WL3, the reference word line RWL1 is selected at the same time.

When the selected word line is one of the second word lines WL4, WL5, WL6, and WL7, the reference word line RWL0 is selected at the same time.

For example, when the word line WL3 is selected, the reference memory cell isolation switches S41 and S42 are turned off in response to a reference memory cell isolation signal RISO1, and the reference memory cell isolation switches S43 and S44 are turned on in response to a reference memory cell isolation signal RISO2.

As a result, the sub reference bit lines RBL40 and RBL41 are disconnected from the bit line BL0, and the reference memory cells RC0 and RC1, which are connected between the sub reference bit lines RBL40 and RBL41 and the reference word line RWL0, are isolated from the memory cells MC.

The reference memory cells RC0 and RC1, which are connected between the sub reference bit lines RBL42 and RBL43 and the reference word line RWL1, are connected to the bit line BL1, and the bit line BL1 outputs a reference signal corresponding to a combination of data "0" and data "1" output from the reference memory cells RC0 and RC1 to the sense amplifier 26.

Also, the memory cell MC, which is connected between the word line WL3 and the bit line BL0, outputs stored data through the bit line BL0 to the sense amplifier 26. The sense amplifier 26 compares the data and the reference signal, which are applied through the bit lines BL0 and BL1, and determines the data.

In FIG. 7, the two sub reference bit lines RBL40 and RBL41, which are connected in parallel, extend from the bit line BL0, and the two sub reference bit lines RBL42 and RBL43, which are connected in parallel, extend from the bit line BL1. Also, the reference memory cells RC0 and RC1, which store data "0" or data "1," are disposed between the sub reference bit lines RBL40, RBL41, RBL42, and RBL43 and the reference word lines RWL0 and RWL1. Thus, when the memory cell MC of the bit line BL0 outputs data, a reference signal is output through the bit line bit line BL1 corresponding to the bit line BL0.

However, as in FIG. 3, the reference memory cells RC0 and RC1 are disposed in a vertical direction relative to the bit lines BL0 and BL1, so that a distance between the bit lines BL0 and BL1 is increased by about twice the conventional semiconductor memory device.

Figure 8:
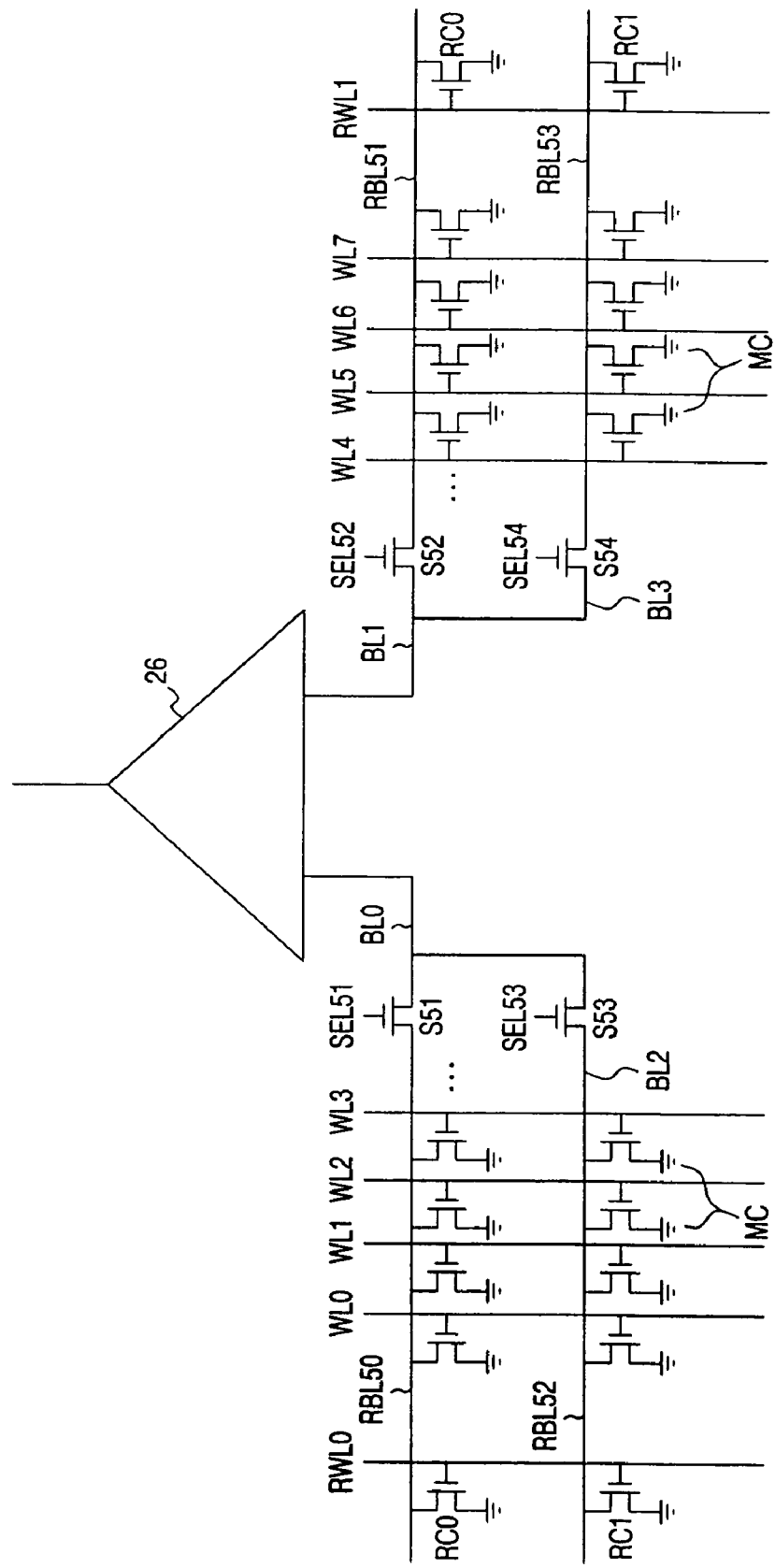
FIG. 8 illustrates a second example of the memory cell array block of the semiconductor memory device including the memory cell without the capacitor shown in FIG. 6.

FIG. 8 illustrates a second exemplary embodiment of a circuit that could be use to implement the memory cell array block of the semiconductor memory device including the memory cells that do not include a capacitor shown in FIG. 6.

Although the memory cell array block of the semiconductor memory device including the memory cells that do not include a capacitor as shown in FIG. 8 is an open-bit-line type like that of FIG. 7, two bit lines disposed on one end of a sense amplifier 26 and another two bit lines disposed on the other end of the sense amplifier 26 are selected at the same time, so that total of four bit lines are selected in a group.

Two bit lines BL0 and BL2, which are connected to one input of the sense amplifier 26, are connected to two reference bit lines RBL50 and RBL52, respectively. And two bit lines BL1 and BL3, which are connected to the other input of the sense amplifier 26, are connected to two reference bit lines RBL51 and RBL53, respectively.

A reference memory cell RC0, which stores data "0," is connected between the reference bit line RBL50 and a reference word line RWL0 and between the reference bit line RBL51 and a reference word line RWL1. A reference memory cell RC1, which stores data "1," is connected between the reference bit line RBL52 and the reference word line RWL0 and between the reference bit line RBL53 and the reference word line RWL1.

Four bit line selection switches S51, S52, S53, and S54 are disposed between the sense amplifier 26 and the bit lines BL0, BL1, BL2, and BL3, respectively. The bit line selection switches S51, S52, S53, and S54 select one bit line for outputting data and two bit lines for outputting a reference signal in response to bit line selection signals SEL51, SEL52, SEL53, and SEL54, and connect the selected bit lines to the sense amplifier 26.

The sense amplifier 26 receives the data and the reference signal from one bit line for transmitting the data and two bit lines for outputting the reference signal, and senses and determines the data.

The operation of the semiconductor memory device including the memory cells that do not include a capacitor will now be described with reference to FIG. 8. A row address decoder (not shown) decodes an externally applied address and selects one from a plurality of word lines WL0, WL1, WL2, WL3, WL4, WL5, WL6, and WL7.

When the selected word line is one of first word lines WL0, WL1, WL2, and WL3, the reference word line RWL1 is selected at the same time. When the selected word line is one of second word lines WL4, WL5, WL6, and WL7, the reference word line RWL0 is selected at the same time. For example, when the word line WL6 and the bit line BL3 are selected, the bit line selection switch S52 is turned off in response to the bit line selection signal SEL52, and the bit line selection switches S51, S53, and S54 are turned on in response to the bit line selection signals SEL51, SEL53, and SEL54.

As a result, the bit line BL1 is disconnected from the sense amplifier 26, and the bit lines BL0, BL2, and BL3 are connected to the sense amplifier 26.

The reference memory cells RC0 and RC1, which are connected between the reference bit lines RBL50 and RBL52 and the reference word line RWL0, output a reference signal corresponding to a combination of data "0" and data "1", which are output from the reference memory cells RC0 and RC1 through the bit lines BL0 and BL2, respectively, to the sense amplifier 26.

Also, the memory cell MC, which is connected between the word line WL6 and the bit line BL3, outputs stored data through the bit line BL3 to the sense amplifier 26.

The sense amplifier 26 compares the data and the reference signal, which are applied through the bit lines BL0, BL2, and BL3, and determines the data.

Like the memory cell array block of FIG. 5, the memory cell array block of FIG. 8 may include a reference memory cell refresh switch and first and second power supplies to enable the reference memory cells to be refreshed. However, as is shown in the exemplarily illustrated in FIG. 8, the reference memory cells can be refreshed using the sense amplifier 26.

Figure 9:
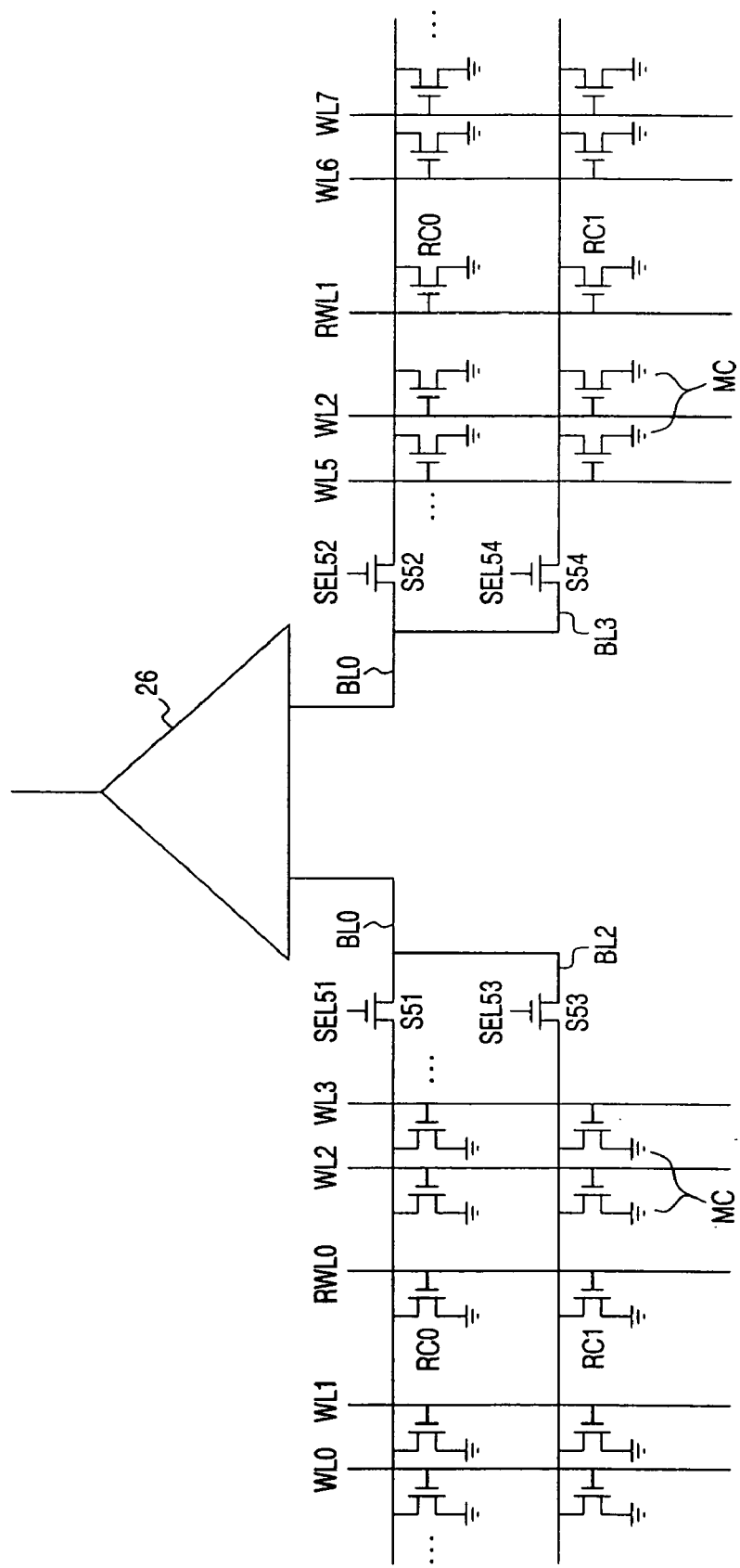
FIG. 9 illustrates a third example of the memory cell array block of the semiconductor memory device including the memory cell without the capacitor shown in FIG. 6.

FIG. 9 illustrates a third exemplary embodiment of a circuit that can be used to implement the memory cell array block of the semiconductor memory device including the memory cells that do not include a capacitor shown in FIG. 6.

The memory cell array block of FIG. 9 is similar in structure to that of FIG. 8, but FIG. 9 shows that reference word lines RWL0 and RWL1 and reference memory cells may be disposed between word lines WL0, WL1, . . . , and WL7 and memory cells MC.

The memory cell array blocks of the semiconductor memory devices including the memory cells that do not include capacitors shown in FIGS. 3 through 5 are explained as the folded-bit-line types, while the memory cell array blocks of the semiconductor memory devices including the memory cells that do not include capacitors shown in FIGS. 7 through 9 are explained as the open-bit-line types. In other embodiments, it is possible that the memory cell array blocks shown in FIGS. 3 through 5 may have open-bit-line structures, and the memory cell array blocks shown in FIGS. 7 through 9 may have folded-bit-line structures.

Figure 10:
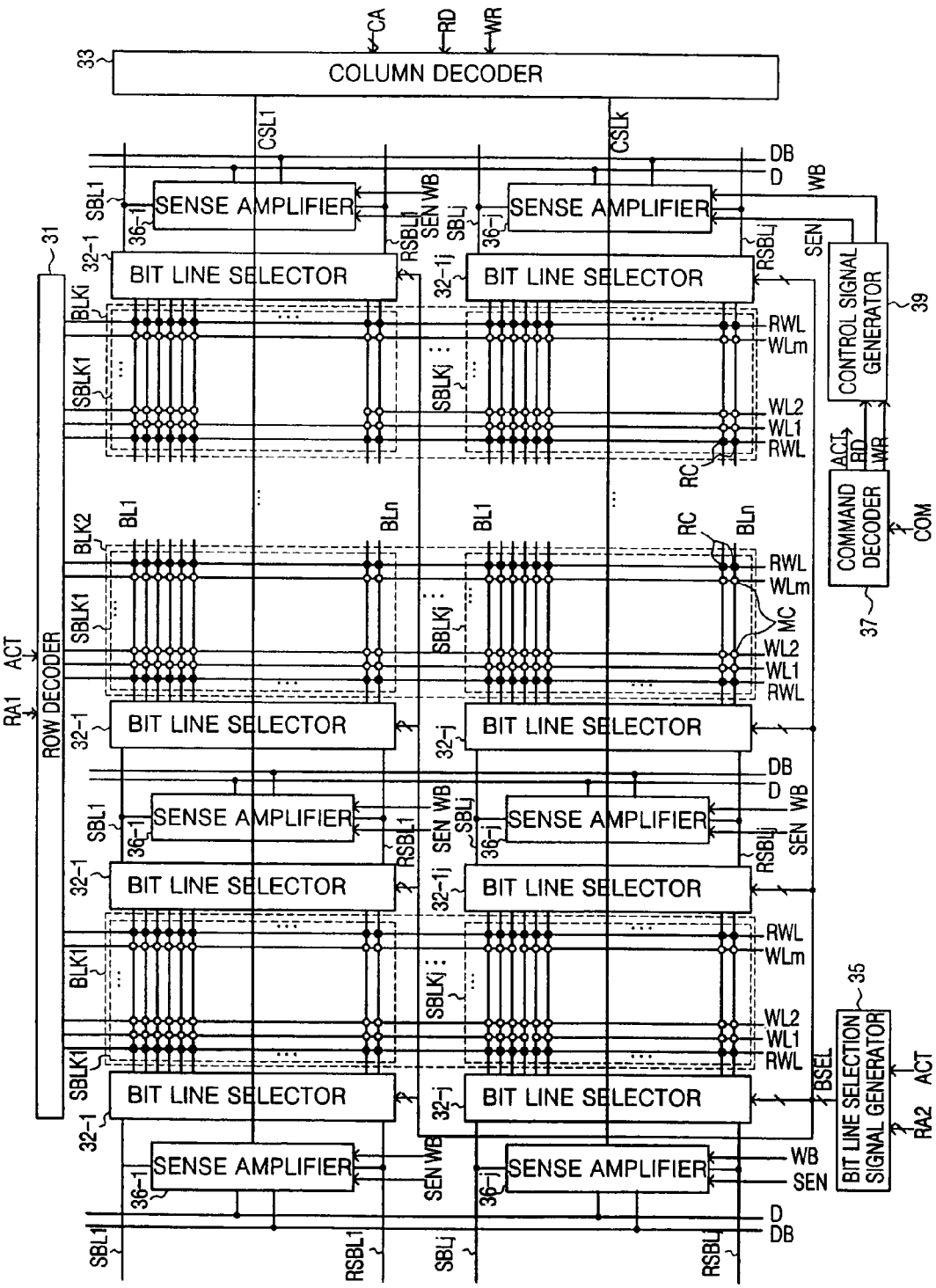
FIG. 10 is a block diagram of a semiconductor memory device including a memory cell without a capacitor according to the present disclosure.

FIG. 10 is a block diagram of another embodiment of a semiconductor memory device including a memory cells that do not include a capacitor. The semiconductor memory device including the memory cells that do not include a capacitor shown in FIG. 10 includes memory cell array blocks BLK1 to BLKi, bit line selectors 32-1 to 32-j, sense amplifiers 36-1 to 36-j, a row decoder 31, a column decoder 33, a bit line selection signal generator 35, a command decoder 37, and a control signal generator 39.

FIG. 10 shows an embodiment where two data are input and output through two pairs of data lines D and DB disposed at both ends of the memory cell array blocks BLK1 to BLKi.

The memory cell array blocks BLK1 to BLKj include sub memory cell array blocks SBLK1 to SBLKj, respectively. Each of the sub memory cell array blocks SBLK1 to SBLKj includes memory cells MC, which are connected between bit lines BL1 to BLn and word lines WL1 to WLm, and reference memory cells RC, which are connected between the bit lines BL1 to BLn and reference word lines RWL.

The sub memory cell array blocks SBLK1 to SBLKj and the sense amplifiers 36-1 to 36-j of FIG. 10 can be the memory cell array blocks and the sense amplifiers of FIGS. 2 through 9, respectively.

Each of the memory cells MC and reference memory cells RC includes an NMOS transistor having a floating body. The NMOS transistor has a source terminal connected to a ground voltage, a gate terminal connected to the word lines WL1 to WLm or the reference word lines RWL, and a drain terminal connected to the bit lines BL1 to BLn.

The semiconductor memory device including the memory cells that do not include a capacitor shown in FIG. 10 will now be described in detail. The row decoder 31 decodes a first row address RA1 in response to an active command ACT, enables one of the word lines WL1 to WLm, and enables the reference word line RWL corresponding to the enabled word line at the same time. Also, when reference memory cell isolation switches are connected to reference bit lines as shown in FIGS. 3, 4, 5, and 7, the row decoder 31 further generates a reference memory cell isolation signal corresponding to the enabled word line.

The column decoder 33 decodes a column address CA in response to a write command WR or a read command RD and enables one of column selection signals CSL1 to CSLk.

The bit line selection signal generator 35 decodes a second row address RA2 in response to the active command ACT and outputs a bit line selection signal BSEL to corresponding one of the bit line selectors 32-1 to 32-j.

Each of the bit line selectors 32-1 to 32-j selects one bit line for outputting data and another bit line for outputting a reference signal from the bit lines BL1 to BLn of the sub memory cell array blocks SBLK1 to SBLKj in response to the bit line selection signal BSEL and enables the selected bit lines.

The command decoder 37 generates the active command ACT, the read command RD, and the write command WR in response to a command signal COM.

The control signal generator 39 enables a write back signal WB in response to the write command WR, and enables a sense amplifier enable signal SEN and then enables the write back signal WB after a predetermined amount of time in response to the read command RD.

The write back signal WB is a signal generated when data is written in the memory cell MC through the sense amplifiers 36-1 to 36-j that are current sense amplifiers. This write back signal WB may be omitted or replaced with another signal according to the structure of the sense amplifiers 36-1 to 36-j used for semiconductor memory devices.

In each of the memory cells MC of the memory cell array blocks BLK1 to BLKj, when a predetermined voltage (e.g., 1.5 V) is applied to the corresponding word line WL1 to WLm and a voltage higher than or the same as the predetermined voltage (e.g., 1.5 V) is applied to the corresponding bit line of the sub memory cell array blocks SBLK1 to SBLKj, data "1" is written. However, when a voltage lower than the predetermined voltage (e.g., −1.5 V) is applied to the corresponding bit line of the sub memory cell array blocks SBLK1 to SBLKj, data "0" is written.

Also, data may be written in the reference memory cell RC in the same manner as when data is written in the memory cell MC. As shown in FIGS. 3, 4, 5, and 7, the memory cell array block may further include reference memory cell refresh switches, and the control signal generator 39 may further generate a reference memory cell refresh signal, so that the reference memory cell RC may receive data from an additional power supply to write data therein.

During a read operation, when a predetermined voltage (e.g., 1.5 V) is applied to corresponding one of the word lines WL1 to WLm and a voltage (e.g., 0.2 V) for driving a transistor in a linear region is applied to corresponding bit line, data stored in the memory cell MC is output to the corresponding bit line. Simultaneously, as shown in FIGS. 3 through 5 and 7 through 9, the reference memory cell RC is enabled, generates a reference signal, and outputs it to the corresponding bit line.

The sense amplifiers 36-1 to 36-j sense and determine the data and the reference signal, which are applied through the bit lines BL1 to BLn, and output data and inverted data to data lines D and DB.

As described above, in a semiconductor memory device including a memory cells that do not include a capacitor according to the present invention, each of the bit lines of a memory cell array is connected to a-reference memory cell, and when one bit line is selected, its corresponding bit line outputs a reference signal so that a distance between the selected bit line and the corresponding bit line for outputting the reference signal is always substantially the same. Therefore, the sensitivities of data and the reference signal applied to a sense amplifier are held constant, thus reducing data errors.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A semiconductor memory device including a memory cell without a capacitor, the device comprising:
a memory cell array block configured to store data, the memory cell array block including first memory cells and second memory cells, each first memory cell having a floating body connected between a first bit line and a set of first word lines, each second memory cell having a floating body connected between a second bit line and a set of second word lines; and
a reference memory cell array block configured to output a reference signal, the reference memory cell array block including first reference memory cells and second reference memory cells, each first reference memory cell having a floating body connected between a first reference bit line that is connected to the first bit line and a first reference word line, each second reference memory cell having a floating body connected between a second reference bit line that is connected to the second bit line and a second reference word line,
wherein when the first word lines are selected, the second reference memory cells are selected, when the second word lines are selected, the first reference memory cells are selected, and the reference signal is generated from a combination of data "1" and data "0" that are stored in a first reference memory cell and second reference memory cell.

2. The semiconductor memory device according to claim 1, further comprising at least one sense amplifier configured to receive the data and the reference signal to sense and determine the data.

3. The semiconductor memory device according to claim 2, wherein in the reference memory cell array block,
each of the first reference memory cells is connected between the first reference word line and a first sub reference bit line and a second sub reference bit line, which are connected to and diverge from the first reference bit line, and is configured to store a data "1" and a data "0," and
each of the second reference memory cells is connected between the second reference word line and a third reference bit line and a fourth sub reference bit line, which are connected to and diverge from the second reference bit line, and is configured to store a data "1" and a data "0."

4. The semiconductor memory device according to claim 3, wherein the reference memory cell array block further comprises:
two first reference memory cell isolation switches configured to isolate the first reference memory cells from the memory cell array block in response to a first reference memory cell isolation signal;
two second reference memory cell isolation switches configured to isolate the second reference memory cells from the memory cell array block in response to a second reference memory cell isolation signal; and
four reference memory cell refresh switches configured to connect a first power supply configured to supply a voltage corresponding to the data "1" and a second power supply configured to supply a voltage corresponding to the data "0" to the first and the second reference memory cells in response to a reference memory cell refresh signal configured to refresh the first and second reference memory cells.

5. The semiconductor memory device according to claim 4, further comprising a controller configured to decode externally applied addresses during a read operation to enable a pair of adjacent bit lines, wherein one bit line of the pair of adjacent bit lines is selected from a set of first bit lines and the other bit line of the pair of adjacent but lines is selected from a set of second bit lines, wherein the controller is configured to turn off the first reference memory cell isolation switches and to turn on the second reference memory cell isolation switches when the first word line and the second reference word line are enabled, and to turn on the first reference memory cell isolation switches and to turn off the second reference memory cell isolation switches when the second word line and the first reference word line are enabled.

6. The semiconductor memory device according to claim 5, wherein the controller comprises:
- a row decoder configured to decoding a first row address of the externally applied addresses during the read operation to enable one word line of the first and second word lines and one reference word line of the first and second reference word lines corresponding to the one word line;
- a bit line selection signal generator configured to receive a second row address of the externally applied addresses during the read operation to output a bit line selection signal configured to select the first and second bit lines;
- a bit line selector configured to receive the bit line selection signal during the read operation to enable a pair of adjacent bit lines, which are comprised of a bit line selected from the first bit lines and a bit line selected from the second bit lines;
- a column decoder configured to decode a column address of the externally applied addresses during the read operation to enable one of column selection signals configured to select one of the sense amplifiers; and
- a control signal generator configured to enable a sense amplifier enable signal and a write back signal, to disable the reference memory cell refresh signal, and to enable one of the first and second reference memory cell isolation signals during the read operation.

7. The semiconductor memory device according to claim 2, wherein in the reference memory cell array block, each of the first reference memory cells is connected between the first reference bit line and the first reference word line and stores data "1" and data "0," and each of the second reference memory cells is connected between the second reference bit line and the second reference word line and stores data "1" and data "0."

8. The semiconductor memory device according to claim 7, wherein the reference memory array block comprises:
- a first reference memory cell isolation switch configured to isolate the first reference memory cells from the memory cell array block in response to a first reference memory cell isolation signal;
- a second reference memory cell isolation switch configured to isolate the second reference memory cells from the memory cell array block in response to a second reference memory cell isolation signal;
- a first reference signal generating switch configured to connect the first reference memory cells that store data "0" and data "1" to generate the reference signal in response to a first reference signal generating signal;
- a second reference signal generating switch configured to connect the second reference memory cells that store data "0" and data "1" to generate the reference signal in response to a second reference signal generating signal; and
- four reference memory cell refresh switches configured to connect a first power supply configured to supply a voltage corresponding to data "1" and a second power supply configured to supply a voltage corresponding to data "0" with the first and second reference memory cells in response to a reference memory cell refresh signal configured to refresh the first and second reference memory cells.

9. The semiconductor memory device according to claim 8, further comprising:
- a controller configured to decode externally applied addresses during a read operation to enable a pair of adjacent bit lines, wherein one bit line of the pair of adjacent bit lines is selected from the first bit lines and the other bit line of the pair of adjacent bit lines is selected from the second bit lines, the controller configured to turn on the second reference memory cell isolation switch and the second reference signal generating switch and to turn off the first reference memory cell isolation switch and the first reference signal generating switch when the first word line and the second reference word line are enabled, and to turn on the first reference memory cell isolation switch and the first reference signal generating switch and to turn off the second reference memory cell isolation switch and the second reference signal generating switch when the second word line and the first reference word line are enabled.

10. The semiconductor memory device according to claim 9, wherein the controller comprises:
- a row decoder configured to decode a first row address of the externally applied addresses during the read operation to enable one word line of the first and second word lines and one reference word line of the first and second reference word lines corresponding to the one word line;
- a bit line selection signal generator configured to receive a second row address of the externally applied addresses during the read operation to output a bit line selection signal configured to select the first and second bit lines;
- a bit line selector configured to receive the bit line selection signal during the read operation to enable a pair of adjacent bit lines, wherein one bit line is selected from the first bit lines and the other bit line is selected from the second bit lines;
- a column decoder configured to decode a column address of the externally applied addresses during the read operation to enable one of column selection signals configured to select one of the sense amplifiers; and
- a control signal generator configured to enable a sense amplifier enable signal and a write back signal, to disable the reference memory cell refresh signal, and to enable one of the first and second reference memory cell isolation signals and one of the first and second reference signals configured to generate signals during the read operation.

11. A semiconductor memory device including a memory cell without a capacitor, the device comprising:
- a memory cell array block configured to store data, the memory cell array block including first memory cells and second memory cells, each first memory cell having a floating body connected between a first bit line and a set of first word lines, each second memory cell having a floating body connected between a second bit line and a set of second word lines; and
- a reference memory cell array block configured to output a reference signal, the reference memory cell array block including a first reference memory cell and second reference memory cells, the first reference memory cell having a floating body connected between a first reference bit line connected to the first bit line and a reference word line and configured to store data "0" or data "1," each second reference memory cell having a floating body connected between a second reference bit line connected to the second bit line and the reference word line and configured store inverted data of the data stored in the first reference memory cell, wherein when the first word lines or the second word lines are selected, the first reference memory cells and second reference memory cells are selected at the same time, so that the reference signal is generated by a combination of data "1" and data "0" that are stored in a first reference memory cell and a second reference memory cell.

12. The semiconductor memory device according to claim 11, further comprising one or more sense amplifiers configured to receive the data and the reference signal to sense and determine the data.

13. The semiconductor memory device according to claim 12, wherein the reference memory cell array block further comprises:
a reference signal generating switch configured to connect the first and second reference memory cells that store data "0" and data "1," to generate the reference signal in response to a reference signal generating signal;
a first reference bit line selection switch configured to connect the first reference bit line with the first bit line in response to a first reference bit line selection signal enabled when the second word lines are selected;
a second reference bit line selection switch configured to connect the second reference bit line with the second bit line in response to a second reference bit line selection signal enabled when the first word lines are selected; and
two reference memory cell refresh switches configured to connect a first power supply configured to supply a voltage corresponding to data "1" and a second power supply configured to supply a voltage corresponding to data "0" with the first and second reference memory cells in response to a reference memory cell refresh signal configured to refresh the first and second reference memory cells.

14. The semiconductor memory device according to claim 13, further comprising:
a controller configured to decode externally applied addresses during a read operation to enable a pair of bit lines, wherein one of the pair of bit lines is selected from the first bit lines and the other of the pair of bit lines is selected from the second bit lines, the controller configured to turn off the first reference bit line selection switch and to turn on the second reference bit line selection switch and the reference signal generating switch when the first word line and the reference word line are enabled, and to turn on the first reference bit line selection switch and the reference signal generating switch and to turn off the second reference bit line selection switch when the second word line and the reference word line are enabled.

15. The semiconductor memory device according to claim 14, wherein the controller comprises:
a row decoder configured to decode a first row address of the externally applied addresses during the read operation to enable one word line of the first and second word lines and the reference word line;
a bit line selection signal generator configured to receive a second row address of the externally applied addresses during the read operation to output a bit line selection signal configured to select the first and second bit lines;
a bit line selector configured to receive the bit line selection signal during the read operation to enable a pair of bit lines, which are comprised of one bit line selected from the first bit lines and the other bit line selected from the second bit lines;

a column decoder configured to decode a column address of the externally applied addresses during the read operation to enable one of column selection signals configured to select one of the sense amplifiers; and
a control signal generator configured to enable a sense amplifier enable signal, a write back signal, and the reference signal generating signal and to disable the reference memory cell refresh signal during the read operation.

16. A semiconductor memory device including a memory cell without a capacitor, the device comprising:
a memory cell array block configured for storing data, the memory cell array block including first memory cells and second memory cells, each first memory cell having a floating body connected between a first pair of bit lines including first and third bit lines and a set of first word lines, each second memory cell having a floating body connected between a second pair of bit lines including second and fourth bit lines and a set of second word lines; and
a reference memory cell array block configured to output a reference signal, the reference memory cell array block having first reference memory cells and second reference memory cells, each first reference memory cell having a floating body connected between first and third reference bit lines, which are connected to the first and third bit lines, and a first reference word line and configured to output the reference signal, each second reference memory cell having a floating body connected between second and fourth reference bit lines, which are connected to the second and fourth bit lines, and a second reference word line and configured to output the reference signal,
wherein when the first word lines are selected, the second reference memory cells are selected, when the second word lines are selected, the first reference memory cells are selected, and the reference signal is generated by a combination of data "1" and data "0" that are stored in the first and second reference memory cells.

17. The semiconductor memory device according to claim 16, further comprising a set of sense amplifiers configured to receive the data and the reference signal to sense and determine the data.

18. The semiconductor memory device according to claim 17, wherein the memory cell array block further comprises:
a first bit line selection switch configured to connect the first bit line with the sense amplifier in response to a bit line selection signal;
a second bit line selection switch configured to connect the second bit line with the sense amplifier in response to the bit line selection signal;
a third bit line selection switch configured to connect the third bit line with the sense amplifier in response to the bit line selection signal; and
a fourth bit line selection switch configured to connect the fourth bit line with the sense amplifier in response to the bit line selection switch.

19. The semiconductor memory device according to claim 18, further comprising:
a controller configured to decode externally applied addresses during a read operation, the controller configured to additionally select the second and fourth bit lines, turning on the first, second, and fourth bit line selection switches, and to turn off the third bit line selection switch when the first word line, the first bit line, and the second reference word line are enabled; to additionally select the second and fourth bit lines, to turn on the second, third, and fourth bit line selection switches, and to turn off the first bit line selection switch when the first word line, the third bit line, and the second reference word line are enabled; to additionally select the first and third bit lines, to turn on the first, third, and fourth bit line selection switches, and to turn off the second bit line selection switch when the second word line, the second bit line, and the first reference word line are enabled; and to additionally select the first and third bit lines, to turn on the first, second, and third bit line selection switches, and to turn off the fourth bit line selection switch when the second word line, the fourth bit line, and the first reference word line are enabled.

20. The semiconductor memory device according to claim 19, wherein the controller comprises:

a row decoder configured to decode a first row address of the externally applied addresses during the read operation to enable one word line of the first and second word lines and one reference word line of the first and second reference word lines corresponding to the one word line;

a bit line selection signal generator configured to receive a second row address of the externally applied addresses during the read operation to output the bit line selection signal configured to select the first, second, third, and fourth bit lines;

a bit line selector configured to receive the bit line selection signal during the read operation to enable three bit lines of the first, second, third, and fourth bit lines;

a column decoder configured to decode a column address of the externally applied addresses during the read operation to enable one of column selection signals configured to select one of the sense amplifiers; and a control signal generator configured to enable a sense amplifier enable signal and a write back signal during the read operation.

* * * * *